(12) United States Patent  
Deliwala et al.

(10) Patent No.: US 11,695,093 B2  
(45) Date of Patent: Jul. 4, 2023

(54) SUPERLATTICE PHOTODETECTOR/LIGHT EMITTING DIODE

(71) Applicant: Analog Devices, Inc., Norwood, MA (US)

(72) Inventors: Shrenik Deliwala, Andover, MA (US); Ryan Michael Iutzi, Somerville, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 16/679,549

(22) Filed: Nov. 11, 2019

(65) Prior Publication Data

US 2020/0161502 A1 May 21, 2020

Related U.S. Application Data

(60) Provisional application No. 62/770,475, filed on Nov. 21, 2018.

(51) Int. Cl.
*H01L 33/06* (2010.01)
*H01L 33/58* (2010.01)
(Continued)

(52) U.S. Cl.
CPC ............ *H01L 33/06* (2013.01); *H01L 31/024* (2013.01); *H01L 31/02327* (2013.01);
(Continued)

(58) Field of Classification Search
CPC ............ H01L 33/0008; H01L 33/0016; H01L 33/002; H01L 33/0025; H01L 33/0045;
(Continued)

(56) References Cited

U.S. PATENT DOCUMENTS 4,577,209 A * 3/1986 Forrest ............... H04B 10/40  
257/432  
5,404,370 A * 4/1995 Otsubo ............ H01S 5/18333  
372/45.01

(Continued)

FOREIGN PATENT DOCUMENTS

CN 1491468 A 4/2004  
CN 1874088 A 12/2006  
(Continued)

OTHER PUBLICATIONS

AU—Yuewei ZhangAU—Sriram KrishnamoorthyAU—Jared M. JohnsonAU—Fatih AkyolAU—Andrew AllermanAU—Michael W. MoseleyAU—Andrew ArmstrongAU—- Jinwoo HwangAU—Siddharth RajanTI—Interband tunneling for hole injection in III-nitride ultraviolet emittersPT—Journal ArticleDP—2015TA—Applied Physics LettersPG—141103VI—106IP—14AID—10.1063/1.4917529 [doi]4099—https://aip.scitation.org/doi/abs/10.1063/1.49175294100—https://aip.scitation.org/doi/full/10.1063/1.4917529SO—Applied Physics Letters Apr. 2015 106(14): 141103.

(Continued)

*Primary Examiner* — Natalia A Gondarenko  
(74) *Attorney, Agent, or Firm* — ArentFox Schiff

(57) ABSTRACT

A device emitting mid-infrared light that comprises a semiconductor substrate of GaSb or closely related material. The device can also comprise epitaxial heterostructures of InAs, GaAs, AlSb, and related alloys forming light emitting structures cascaded by tunnel junctions. Further, the device can comprise light emission from the front, epitaxial side of the substrate.

22 Claims, 19 Drawing Sheets

(51) Int. Cl.
*H01L 33/64* (2010.01)
*H01L 31/0352* (2006.01)
*H01L 31/0232* (2014.01)
*H01L 31/024* (2014.01)

(52) U.S. Cl.
CPC ...... *H01L 31/035236* (2013.01); *H01L 33/58* (2013.01); *H01L 33/644* (2013.01)

(58) Field of Classification Search
CPC ............. H01L 33/0054; H01L 33/0062; H01L 33/0066; H01L 33/04; H01L 33/06; H01L 33/10; H01L 33/105; H01L 33/26; H01L 33/28; H01L 33/36; H01L 33/58; H01L 33/44; H01L 33/465; H01L 33/486; H01L 33/646; H01L 33/644; H01L 33/38; H01L 33/387; H01L 31/035263; H01L 31/035272; H01L 31/035281; H01L 31/054; H01L 31/0543; H01L 31/0547; H01L 31/056; H01L 31/024; H01L 31/0256; H01L 31/02725; H01L 31/0304; H01L 31/035236; H01L 31/02327; H01L 31/035254; H01L 2933/0058; H01L 2933/0025; H01L 31/022416; H01L 31/145; H01L 31/147; H01L 31/162; H01L 31/167; H01L 31/184; H01L 31/1852; H01L 31/202; H01L 27/1469–14698; H01L 27/14806; H01L 27/281; H01L 27/30; H01L 27/307; H01L 27/14634; H01L 27/14636; H01L 27/14643; H01L 27/1465; H01L 27/14678; H01L 27/14683; H01L 27/14787
USPC ......... 257/15, 12, 14, 21, 28, 184–189, 432, 257/437, 448, 459, 443, 466
See application file for complete search history.

(56) References Cited

U.S. PATENT DOCUMENTS

| | | | | |
|---|---|---|---|---|
| 5,751,049 A * | 5/1998 | Goodwin | ............ | H01L 27/1465 257/440 |
| 5,853,960 A * | 12/1998 | Tran | .................. | H01L 31/02327 430/321 |
| 7,521,737 B2 * | 4/2009 | Augusto | ........... | H01L 27/14643 257/184 |
| 8,022,390 B1 * | 9/2011 | Kim | .................... | H01L 27/1446 257/21 |
| 8,293,566 B1 * | 10/2012 | Kim | .................. | H01L 27/14694 438/93 |
| 8,350,351 B2 * | 1/2013 | Koyama | ......... | H01L 31/022408 257/448 |
| 9,136,293 B2 * | 9/2015 | Yee | .................... | H01L 27/14621 |
| 9,947,827 B2 | 4/2018 | Miller | | |
| 2005/0123014 A1 | 6/2005 | Shimizu et al. | | |
| 2009/0050905 A1 * | 2/2009 | Abu-Ageel | ............. | H01L 33/20 257/80 |
| 2009/0121246 A1 | 5/2009 | Denbaars et al. | | |
| 2009/0168825 A1 * | 7/2009 | Koda | .................. | H01S 5/18311 372/45.01 |
| 2009/0242913 A1 * | 10/2009 | Kim | ........................ | H01L 33/34 257/98 |
| 2011/0025190 A1 | 2/2011 | Jagt | | |
| 2013/0193464 A1 | 8/2013 | Bae et al. | | |
| 2014/0291790 A1 * | 10/2014 | Hsiao | ................ | H01L 27/14634 257/432 |
| 2017/0263809 A1 | 9/2017 | Atanackovic | | |
| 2018/0204975 A1 | 7/2018 | Miller | | |
| 2021/0091135 A1 * | 3/2021 | Yokogawa | ........ | H01L 27/14623 |

FOREIGN PATENT DOCUMENTS

| | | |
|---|---|---|
| CN | 101192739 A | 6/2008 |
| CN | 101588019 A | 11/2009 |
| CN | 101685942 A | 3/2010 |
| CN | 106981822 A | 6/2017 |
| EP | 1571716 A1 | 9/2005 |
| EP | 1657758 A2 | 5/2006 |
| GB | 2240874 A | 8/1991 |
| JP | 62-217675 A | 9/1987 |
| JP | 2000 091638 A | 3/2000 |
| JP | 2008-258296 A | 10/2008 |
| JP | 2011-192880 A | 9/2011 |
| JP | 2015-185655 A | 10/2015 |
| WO | 2014/174400 A1 | 10/2014 |

OTHER PUBLICATIONS

AU—E. F. SchubertAU—Y.-H. WangAU—A. Y. ChoAU—L.-W. TuAU—G. J. ZydzikTI—Resonant cavity light-emitting diodePT—Journal ArticleDP—1992TA—Applied Physics LettersPG—921-923VI—60IP—8AID—10.1063/1.106489 [doi]4099—https://aip.scitation.org/doi/abs/10.1063/1.1064894100—https://aip.scitation.org/doi/full/10.1063/1.106489SO—Applied Physics Letters Feb. 1992 60(8):921.
L. Esaki. Advances in Semiconductor Superlattices, Quantum Wells and Heterostructures. Journal de Physique Colloques, 1984, 45 (C5), pp. C5-3-C5-21.10.1051/jphyscol:1984501 . jpa-00224109.
UniMCO 4.0: A Unique CAD Tool for LED, OLED, RCLED, VCSEL, & Optical Coatings.

* cited by examiner

SUPERLATTICE PHOTODETECTOR/LIGHT EMITTING DIODE

CROSS-REFERENCE TO RELATED APPLICATION

This application is related to and claims the benefit of priority under 35 U.S.C. § 119(e) to U.S. Provisional Application No. 62/770,475 entitled, "SUPERLATTICE PHOTODETECTOR/LIGHT EMITTING DIODE" filed with the U.S. Patent Office on Nov. 21, 2018, which is hereby incorporated by reference in its entirety.

FIELD OF THE DISCLOSURE

The present disclosure relates to light emitting diodes (LEDs). More specifically, this disclosure describes apparatus and techniques relating to the a superlattice structure which functions both as an LED and/or photodiode (PD).

BACKGROUND

A light-emitting diode (LED) is a two-lead semiconductor light source. It is a p-n junction diode that emits light when activated. When a suitable current is applied to the leads, electrons are able to recombine with electron holes within the device, releasing energy in the form of photons. This effect is called electroluminescence, and the color of the light (corresponding to the energy of the photon) is determined by the energy band gap of the semiconductor. LEDs are typically small (less than 1 $mm^2$) and integrated optical components may be used to shape the radiation pattern.

As stated, an LED operates on the principle of electroluminance, while photodiode works on the principle of the photoconduction. In a Light emitting diode, when electrons and holes recombine, the energy is released in the form of light. Thus, it is termed as Light emitting diode. On the corollary, photodiode generates current when it is exposed to the source of light.

LED and Photodiode are reverse of each other. That is, LED generates light with the help of charge carriers while photodiode generates current due to incident photons. Distilled down, LED converts electric energy into light energy but Photodiode converts light energy into electrical energy.

The use of doped semiconductors to create barriers, injectors, tunnel junction contacts, cascade LED junction, and other related device has long been known in the art. Specially, conventional semiconductor materials can be comprised of doped semiconductor layers placed into contact with each other to create one or more p-n junctions. In the case of light emitting diodes (LEDs), as electrical current is applied to the junctions, electrons and holes combine with each other and emit photons. The energy contained in the emitted photos corresponds to the energy difference between the respective holes and electrons.

Conventional LED device dies have dimensions around one millimeter square and a tenth of a millimeter thick. The die substrates have thin semiconductor heterostructure layers on one side, with the layers patterned by lithography for making electrical contact. Forcing an electrical current through the heterostructure layers can convert electrical power to optical power. Light generated within the heterostructures can be extracted from a die with combinations of surface features and coatings, such that light can escape which would otherwise be mostly confined to the die because of total internal reflection.

High-brightness light emitting diode (LED) chips are also known. These chips can emit light with wavelengths that fall in the near-infrared, visible, or ultraviolet spectral ranges. High-brightness LEDs require several unique design considerations. For example, design considerations for High-brightness LEDs may also involve packaging, thermal management, electrical control, and optical guiding considerations.

In some conventional systems, the dies are mechanically attached, using eutectic bonds or conducting epoxy, to thermally conductive LED packages, which have been specifically developed to dissipate the waste heat from high-brightness LED die. The dies are typically electrically contacted with wire bonds to their surfaces. The electrical drive and control of current through high-brightness LEDs is typically accomplished using specialized integrated circuits developed for the power, voltage, and thermal regulation requirements of high-brightness LEDs.

Semiconductor hetero structures based upon antimonide-arsenide semiconductor materials have been researched and developed for their uses as mid-infrared light emission structures. The great design flexibility available from combinations of these materials has more generally led to interest and developments for transistors, optical detectors, and light emitters.

For mid-infrared light emission, the emission wavelength from a device can be set using bulk alloys, superlattices, or quantum wells. Antimonide-arsenide superlattices and quantum wells are of particular benefit because they can also be engineered to mitigate material loss mechanisms that are prominent difficulties at mid-infrared wavelengths, such as the loss mechanisms of free-carrier absorption and Auger recombination.

Another useful property available with some antimonide-arsenide layer combinations is the ability to form interband tunnel junctions, which allows for light emission stages to be cascaded. Several combinations of antimonide-arsenide layers can provide a double-heterostructure confinement configuration for confining charge carriers to the light emitting alloys, superlattices, or quantum wells.

In a superlattice the electrons (and holes) see a periodic potential which is similar to the periodic potential in bulk crystals. This means that the particle wave functions are no longer localized in one quantum well. They extend to infinity and they are equally likely to be found in any of the quantum wells. The eigenstates are called Bloch states (as in bulk) and the wave functions are periodic.

An electron within the superlattice occupies a continuum of energies. This continuum that is bound by a maximum and a minimum of energy is called miniband, which will be discussed in more detail later in the disclosure.

LED device structures based upon antimonide-arsenide heterostructures have been researched and developed at a few mid-infrared emission wavelengths using various particular devices configurations for the particular wavelength. However, from about 3 to 20 μm, there are wavelength ranges for which LEDs have not been reported. Additionally, high-brightness mid-infrared LEDs based upon antimonide-arsenide heterostructures have not been reported.

Together, the technologies for mechanical packaging, thermal management, electrical control, and optical guiding provide a broad technology base for high-brightness LEDs. This technology base accommodates the semiconductor materials and properties employed for LEDs operating at near-infrared, visible, and ultraviolet wavelengths. However, there are not corresponding mid-infrared high-brightness LEDs, which might take advantage of this technology base, and there are not corresponding mid-infrared high-brightness LEDs with their own supporting specialized industrial technology base. Accordingly, there are a number of improvements that can be made within the art.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

A device emitting mid-infrared light that comprises a semiconductor substrate of GaSb or closely related material. The device can also comprise epitaxial heterostructures of InAs, GaAs, AlSb, and related alloys forming light emitting structures cascaded by tunnel junctions. Further, the device can comprise light emission from the front, epitaxial side of the substrate.

Embodiments of the present invention comprise systems, methods, and apparatus configured to generate mid-infrared LEDs. In particular, embodiments of the present invention comprise mid-infrared high-brightness LEDs that are configured to take advantage of one or more existing support technologies. Additionally, embodiments of the present invention provide unique and novel configurations for LED devices.

Embodiments of the present invention can comprise a device emitting mid-infrared light that comprises a semiconductor substrate of gallium antimonide ("GaSb") or closely related material. The device can also comprise epitaxial heterostructures of indium arsenide ("InAs"), gallium arsenide ("GaAs"), Aluminum Antimonide ("AlSb"), and related alloys forming light emitting structures cascaded by tunnel junctions. Further, the device can comprise light emission from the front, epitaxial side of the substrate.

Additional embodiments of the present invention can comprise a mid-infrared light emitting diode (LED) fabricated from antimonide-arsenide semiconductor heterostructures and configured into a front-side emitting high-brightness LED die. The device can further comprise optical power conversion superlattices comprised of cascaded double heterostructure confinement light emission stages with superlattice electron and hole injectors.

Additional features and advantages of exemplary embodiments of the invention will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

This invention substantially improves on the usability of these LEDs as practical devices for easy packaging, higher light extraction, and better current spreading.

According to one aspect of the present disclosure, a superlattice heterojunction LED with electrical and optical surfaces such that the epitaxial layer is completely or substantially covered with electrode metal is disclosed.

According to another aspect of the present disclosure, a superlattice heterojunction LED with electrical and optical surfaces comprises a second electrical connection is made via ring-like electrode on the substrate leaving region above mesa structure optically open.

According to another aspect of the present disclosure, a superlattice heterojunction LED with electrical and optical surfaces whereby an epitaxial side is bonded to the sub-mount for improved heat flow out of hetero junctions.

According to another aspect of the present disclosure, a superlattice heterojunction LED with electrical and optical surfaces, wherein an optical surface on the substrate from which light emission occurs contains various refractive and diffractive structures such as surface gratings, random etch, optical filters or micro-lenses or Fresnel lenses.

According to another aspect of the present disclosure, a superlattice heterojunction LED with electrical and optical surfaces, wherein LED is bonded to another infrared transparent/translucent substrate that provides both electrical connection and optical function such as lens, grating, or an optical filter.

According to another aspect of the present disclosure, a superlattice heterojunction LED with electrical and optical surfaces, wherein optical emitting surface of the substrate is doped to improve current spreading from the ring electrode.

According to another aspect of the present disclosure, a midwave infrared (MWIR) emitting photodetector with electrical and optical surfaces comprises, an epitaxial layer which is substantially, a majority thereof, or entirely covered with electrode metal.

According to another aspect of the present disclosure, a midwave infrared (MWIR) emitting photodetector with electrical and optical surfaces comprises a second electrical connection which is made via ring-like electrode on the substrate leaving region above mesa structure optically open.

According to another aspect of the present disclosure, the midwave infrared (MWIR) emitting photodetector with electrical and optical surfaces further comprises epitaxial side which is bonded to the sub-mount for improved heat flow out of hetero junctions.

According to another aspect of the present disclosure, the midwave infrared (MWIR) emitting photodetector with electrical and optical wherein the optical surface on the substrate from which light emission occurs contains various refractive and diffractive structures such as surface gratings, random etch, optical filters or micro-lenses or Fresnel lenses.

According to another aspect of the present disclosure, the midwave infrared (MWIR) emitting photodetector with electrical and optical, wherein is bonded to another substrate that provides both electrical connection and optical collection functions.

According to another aspect of the present disclosure, an IR detecting photodetector having superlattice heterojunction with electrical and optical surfaces such that epitaxial layer is completely or substantially covered with electrode metal.

According to another aspect of the present disclosure, an IR detecting photodetector having superlattice heterojunction with electrical and optical surfaces such that the second electrical connection is made via ring-like electrode on the substrate leaving region above mesa structure optically open.

According to another aspect of the present disclosure, an IR detecting photodetector having superlattice heterojunction with electrical and optical surfaces, in which epitaxial side is bonded to the sub-mount for improved heat flow out of hetero junctions is disclosed.

According to another aspect of the present disclosure, an IR detecting photodetector having superlattice heterojunction with electrical and optical surfaces, in which optical surface on the substrate from which light emission occurs contains various refractive and diffractive structures such as surface gratings, random etch, optical filters or micro-lenses or Fresnel lenses is disclosed.

According to another aspect of the present disclosure, an IR detecting photodetector having superlattice heterojunction with electrical and optical surfaces, in which photodetector is bonded to another IR transparent substrate that provides both electrical connection and optical function such as lens, grating, or an optical filter is disclosed.

The drawings show exemplary LED/PD configurations. Variations of these circuits, for example, changing the positions of, adding, or removing certain elements from the circuits are not beyond the scope of the present invention. The illustrated circuits, configurations, and complementary devices are intended to be complementary to the support found in the detailed description.

BRIEF DESCRIPTION OF THE DRAWINGS

For a fuller understanding of the nature and advantages of the present invention, reference is made to the following detailed description of preferred embodiments and in connection with the accompanying drawings, in which.

DETAILED DESCRIPTION

The present disclosure relates to light emitting diodes (LEDs). More specifically, this disclosure describes apparatus and techniques relating to the a superlattice structure which functions both as an LED and/or photodiode (PD).

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Figure 9:
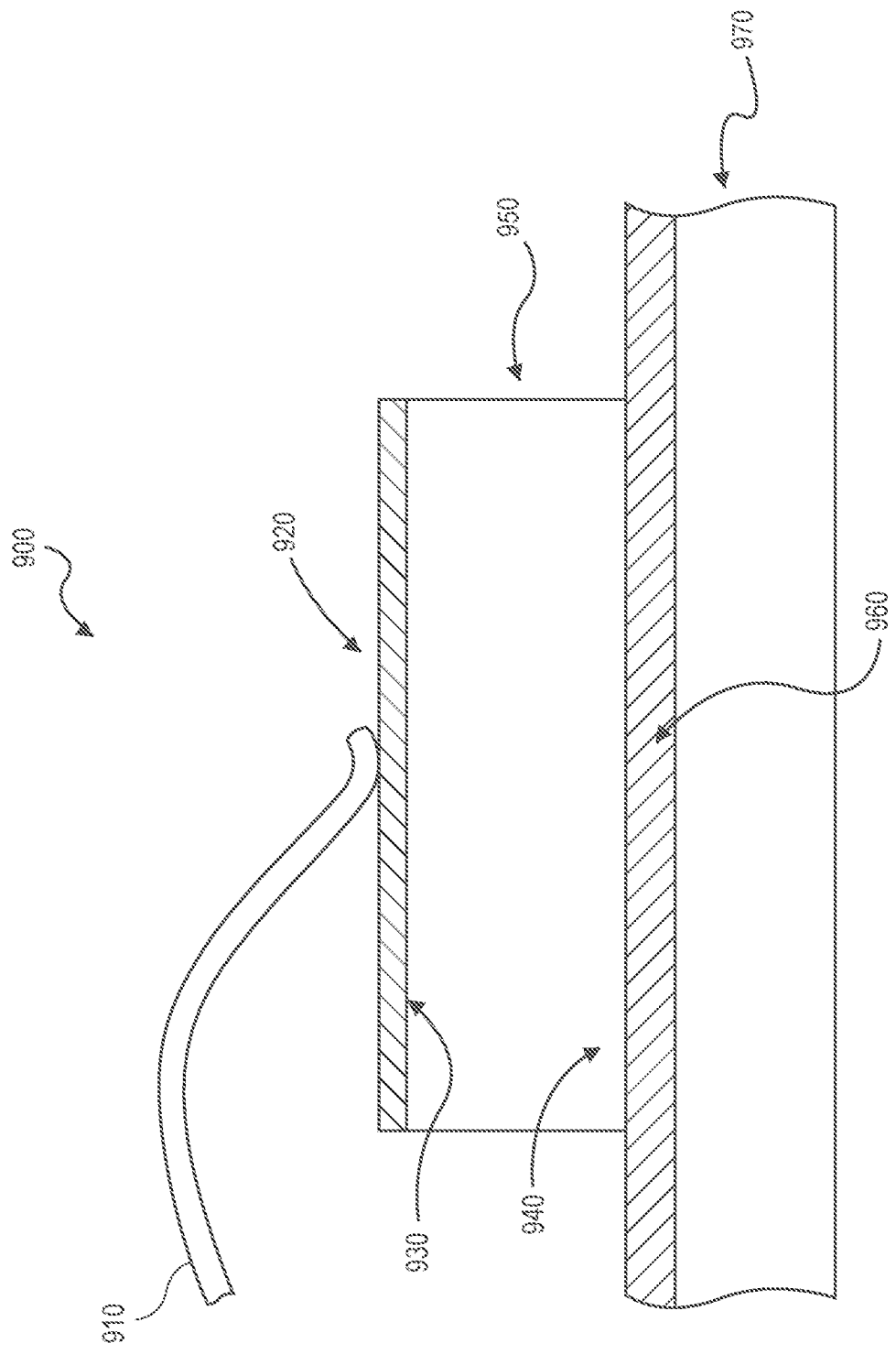
FIG. 9 shows an exemplary light emitting diode, according the present state of the art.

An IR LED (with wavelength range from 2-15 µm) can be constructed from epitaxial heterostructures of InAs, GaSb, AlSb etc. grown on various substrates such as GaSb, GaAs, or Si. These LEDs typically emit from the "front side"—meaning side closest to the epitaxial growth. A device such as this is described is depicted in FIG. 9. which provides necessary ingredients to make a practical front-side emitting LED. These include: cascaded light-emitting structures separated by tunnel junctions, current spreading electrode design to provide good electrical pumping, and butte structures for light extraction for high refractive index substrate.

The present disclosure substantially improves on the efficiency of these LEDs as practical devices for easy packaging, higher light extraction, lower heat generation as well as lower junction temperature, and better current spreading.

Figure 1:
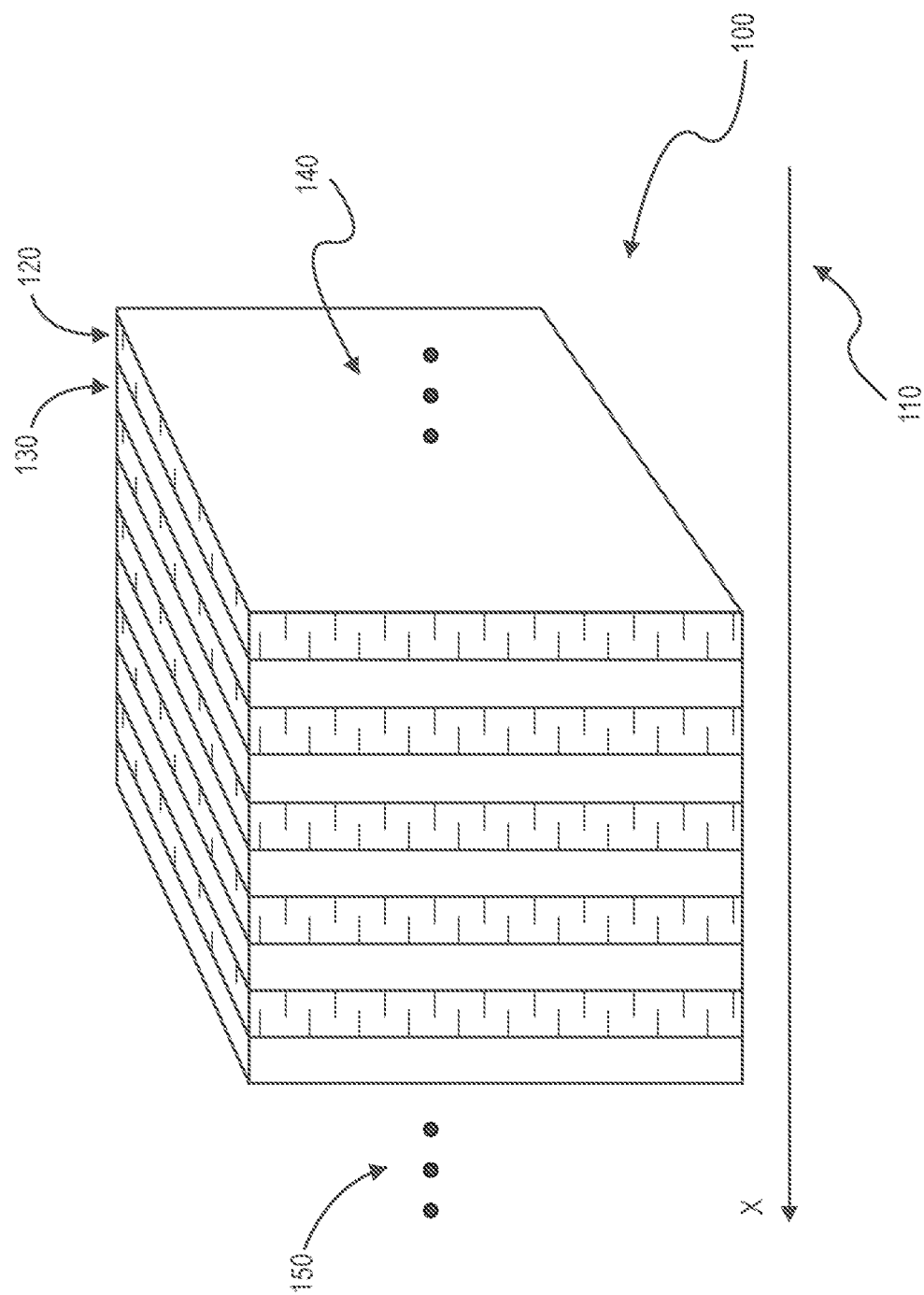
FIG. 1 shows an exemplary stack of semiconductor layers that form a superlattice, according to one or more embodiments of the present invention.

FIG. 1 shows an exemplary stack of semiconductor layers that form a superlattice 100, according to one or more embodiments of the present invention. Superlattice 100 is a semiconductor heterostructure.

A semiconductor heterostructure is built by alternating semiconductors of different types with different band gaps and different electron affinities in order to create an alternating variation of the potential seen by electrons in the conduction band and holes in the valence band. The simplest example of heterostructure is the simple heterojunction between two different semiconductors with energy band offsets.

FIG. 1 illustrates an example of a superlattice 100 formed from InAs 120 and GaSb 130 semiconducting crystal layers. A superlattice heterostructure is made by growing multiple heterojunctions of two different materials with periodic repetition. A heterojunction is the interface that occurs between two layers or regions of dissimilar crystalline semiconductors. These semiconducting materials have unequal band gaps as opposed to a homojunction.

The thickness of each layer within a superlattice is generally very thin (generally 1-5 nm, depending upon lattice mismatch). As a result of these thin layers create quantum wells and carriers can easily tunnel through. Growing a superlattice is one of also a common technique to reduce strain in the (top) epitaxial layer.

Put another way, a semiconductor superlattice is a semiconductor heterostructure can become a superlattice when the thicknesses of the constituting layers fulfill the following conditions: (a) they are smaller than the De-Broglie wavelengths corresponding to confined electrons and holes in wells and barriers, in order to obtain quantum confinement of electrons and holes; and (b) they are sufficiently thin to give enough overlap of adjacent electron and hole wave functions so that quantum tunneling effect can hold through the hetero-structure.

These thicknesses of semiconductors 120 and 130 are periodically repeated in space so that the resulting superstructure of these two different materials forms a kind of periodic lattice called a superlattice 100. It can be appreciated that the continuity of superlattice 100 can be extended in the +x direction 150 and −x direction 140 indefinitely. In general, it is determined by the band gap energy and number of layers.

In one or more embodiments, layers are 1-2 nm thick with a preferred embodiment of 1.5 nm. The number of layers can exceed 500 in bother the n-type and p-type heterogenous structures with a total thickness of 1 μm or more.

FIG. 1 is representative of layer thicknesses that result in the superlattice behaving as an effective medium for these materials are approximately in the range of 1 to 10 nm. In at least one embodiment of interest, the electronic states in the layers couple and disperse into a new miniband of energy, as represented in FIG. 2A for the conduction band of a uniform, periodic superlattice.

Figure 2:
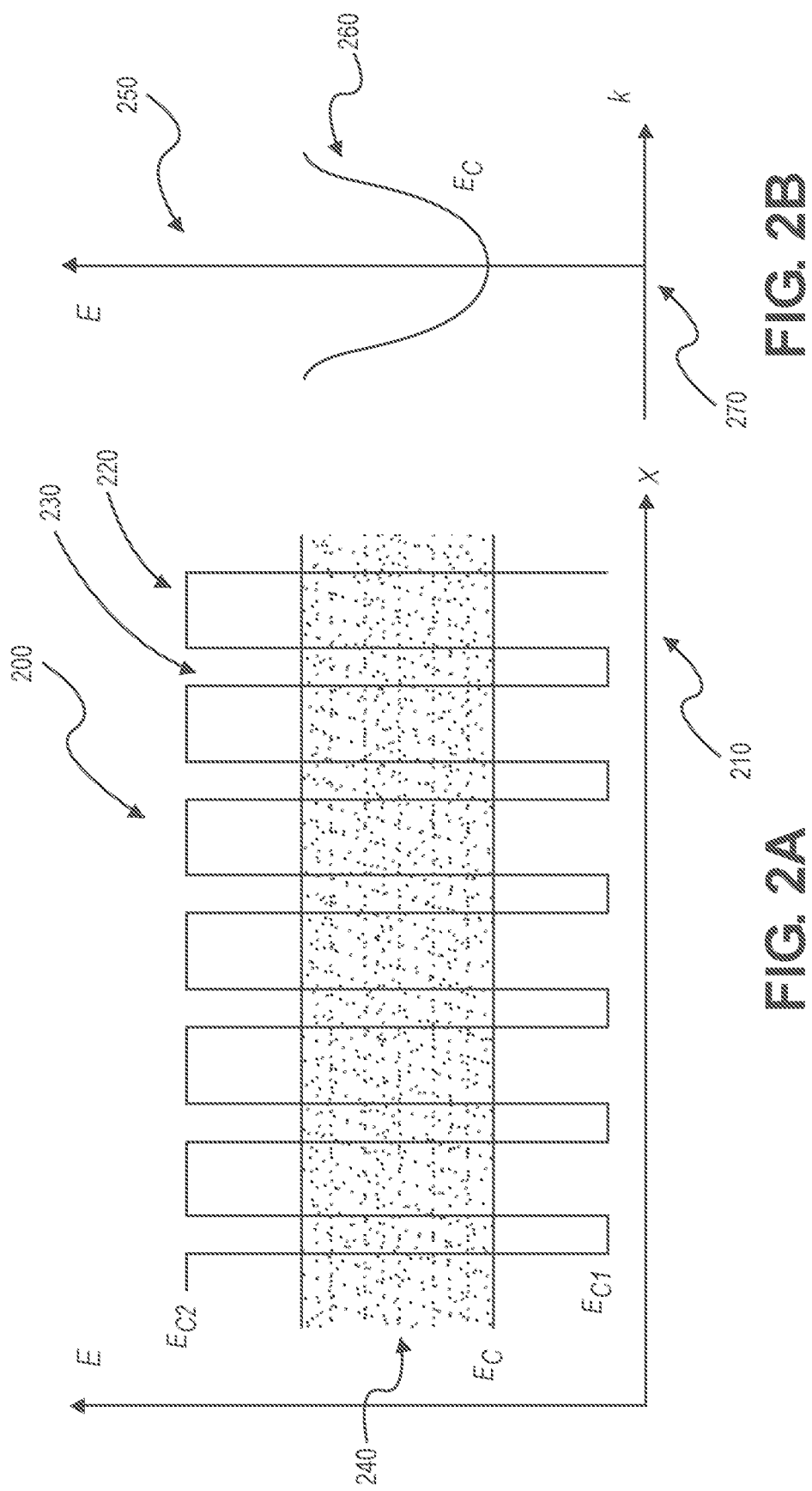
FIG. 2A illustrates a band diagram of electron potential energy versus position through superlattice layers, according to one or more embodiments of the present invention.
FIG. 2B illustrates a dispersion diagram of energy versus electron wave vector, according to one or more embodiments of the present invention.

FIG. 2A illustrates a band diagram 200 of electron potential energy versus position 210 through superlattice layers, according to one or more embodiments of the present invention. In particular, FIG. 2A shows the conduction band edges of the two materials 220, 230 and the resulting superlattice miniband 240 and their constituent states.

The interplay of electronic coupling through barriers and confinement to potential well layers can generate an energy miniband of conduction band states with the lowest edge of the miniband defining the effective conduction band edge $E_C$ for the composite structure.

The band diagram 200 of FIG. 2A plots the electron potential energy E versus position 210 in the superlattice layers 220, 230. The conduction band edges of the two constituent material layers 220 230 are depicted by the sequence of low and high conduction band energies $E_{C1}$ and $E_{C2}$ for the respective materials, forming energy wells and barriers. For the composite structure, the conduction band states quantum mechanically couple throughout the structure to give the gray band of energy states (mini band 240) with the new conduction band edge $E_C$.

FIG. 2B illustrates a dispersion diagram 250 of energy 260 versus electron wave vector 270, according to one or more embodiments of the present invention. Specifically, the diagram in FIG. 2B plots the electron wave state energies E 250 in the miniband 240 versus the electron wave vector k 270.

Figure 3:
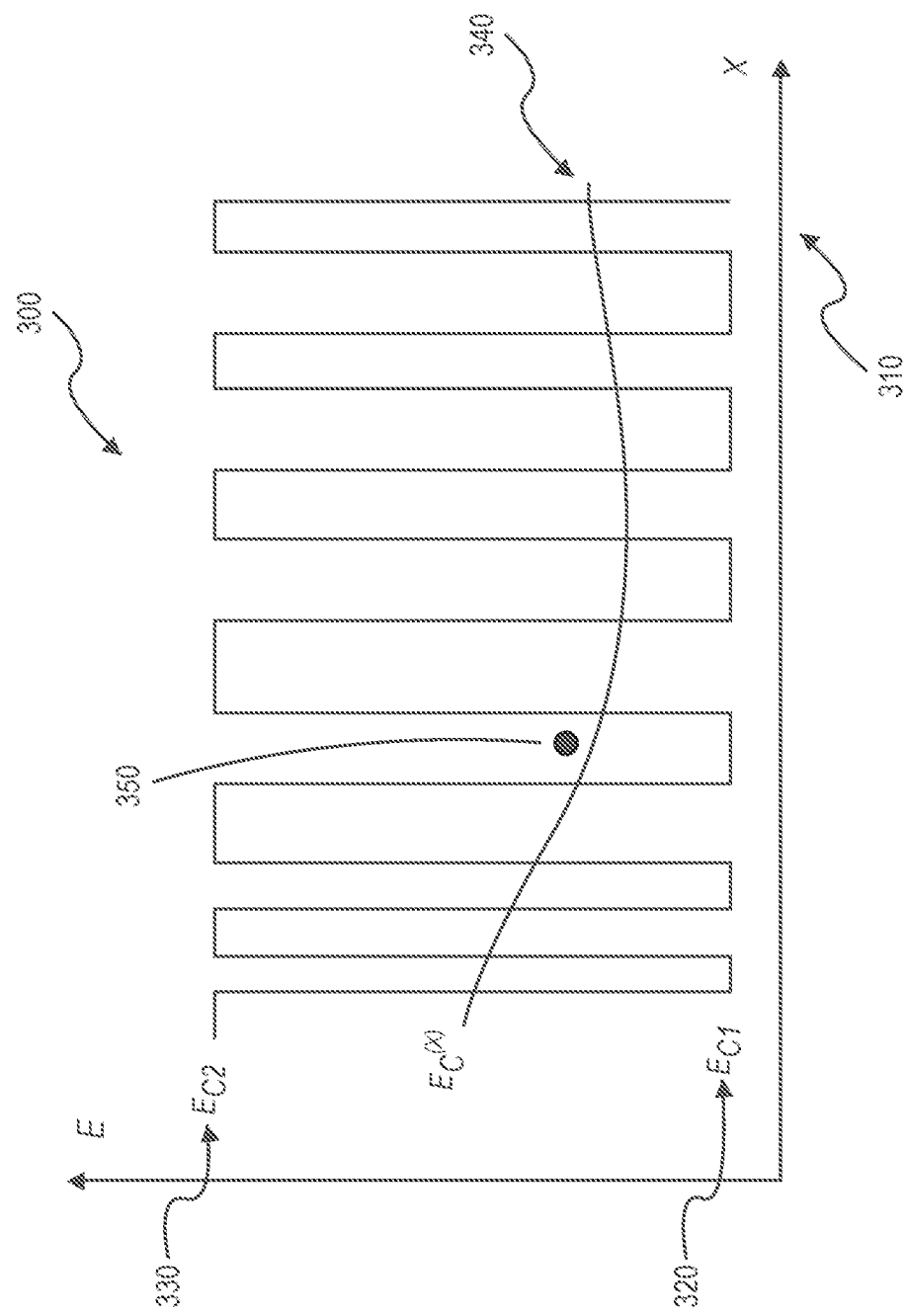
FIG. 3 illustrates another band diagram of electron potential energy versus position through superlattice layers, according to one or more embodiments of the present invention.

FIG. 3 illustrates another band diagram 300 of electron potential energy 340 versus position 310 through superlattice layers, according to one or more embodiments of the present invention. In an alternate embodiment of the present invention, slowly varying the layer thicknesses in the sequence of superlattice periods can slowly vary the corresponding miniband states within the structure.

For example, the band diagram 300 illustrates the effects on the lowest conduction band miniband edge $E_{C(x)}$ 340 of a superlattice with varying layer thicknesses. In particular, the local position of the band edge depends on the interplay of quantum confinement in close-by energy wells and quantum coupling through the energy bathers between the wells.

The lowest conduction band miniband edge $E_{C(x)}$ 340 of a superlattice will depend on the first material conduction band $E_{C1}$ 320, second material conduction band $E_{C2}$ 330, and their respective thicknesses, at least in part. Consequently, one skilled in the art can appreciate that electron carrier 350 will following the lowest conduction band miniband edge $E_{C(x)}$ 340 which is a function of position x 310 within the aperiodic heterogenous structure.

In addition to the impact on the conduction bands, the valence band states also couple and disperse with varying layer thicknesses of the superlattice. In at least some embodiments, the resulting valence band minibands have a great deal more complexity than the conduction band minibands.

Figure 4:
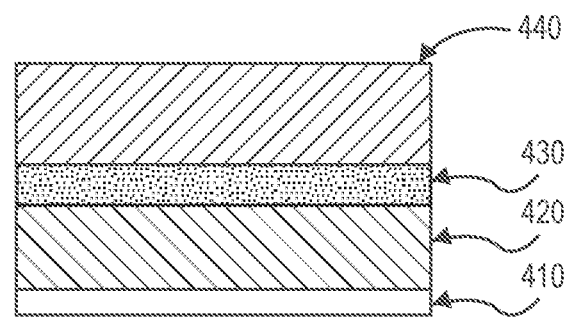
FIG. 4 depicts an exemplary heterogenous structure, according to one or more embodiments of the present invention.

FIG. 4 depicts an exemplary heterogenous structure 400, according to one or more embodiments of the present invention. Heterogenous structure 400 comprises p-type block 440, LED junction 430, n-type block 420, tunnel junction 410.

In one or more embodiments p-type block 440 comprises a superlattice of semiconductor materials doped to have holes as majority carriers. N-type block 420 comprises a superlattice of semiconductor materials doped to have electrons as majority carriers. LED junction 430 represents the interface between p-type block 440 and n-type block 420. In an unbiased or reverse biased state, LED junction 430 is a depletion region acting as an insulator. In a forward bias, LED junction become an active region whereby holes and electrons readily combine and emit photons from electron falling from the conduction band to outer valance shell of the proximal atom.

In some embodiments, tunnel junction 410 a is a barrier, such as a thin insulating layer or electric potential, between two electrically conducting materials. Electrons (or quasi-particles) pass through the barrier by the process of quantum tunneling. Classically, the electron has zero probability of passing through the barrier. However, according to quantum mechanics, the electron has a non-zero wave amplitude in the barrier, and hence it has some probability of passing through the barrier.

Tunnel junctions serve a variety of different purposes. In the context of the present embodiment, tunnel junction 410 serves a carrier supply and a barrier between cascaded devices. In particular, it prevents two or more cascaded devices from reverse biasing thereby prevent current passage. This will be discussed in greater detail later in the disclosure.

In one or more alternate embodiments, p-type block 440 and n-type block 420 combine to form a homogeneous structure or homojunction which is known in the art, rather than a superlattice. A homojunction is a semiconductor interface that occurs between layers of similar semiconductor material, these materials have equal band gaps but typically have different doping.

Figure 5:
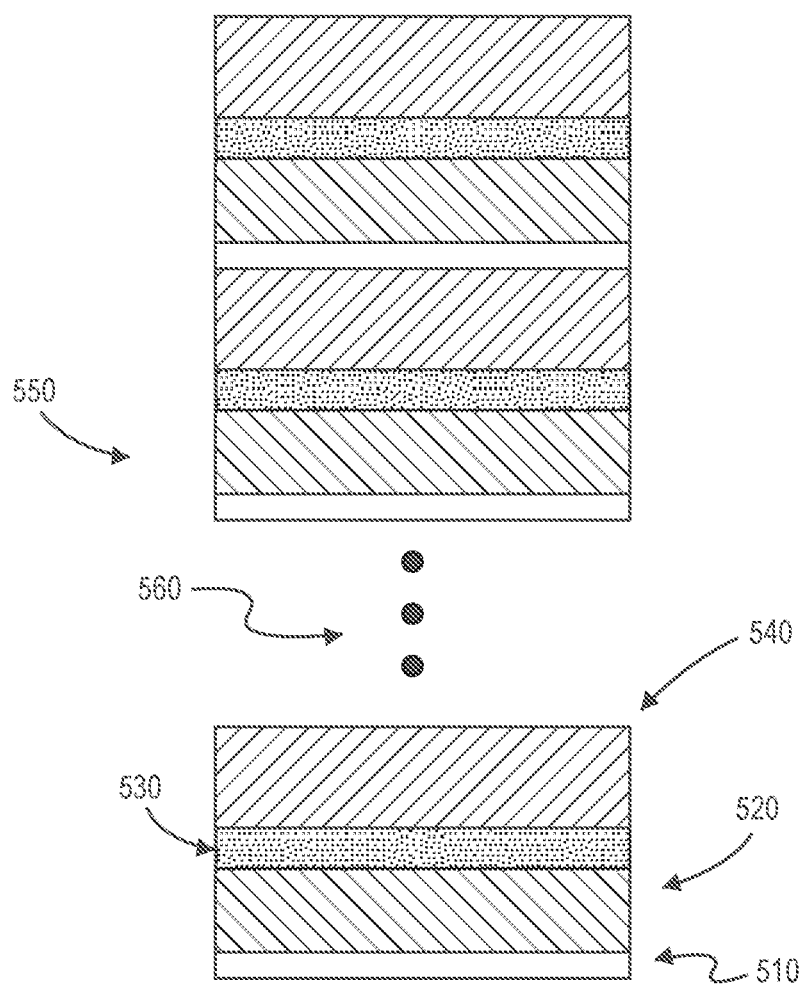
FIG. 5 depicts an exemplary cascade of heterogenous structures, according to one or more embodiments of the present invention.

FIG. 5 depicts an exemplary cascade 550 of heterogenous structures, according to one or more embodiments of the present invention. Heterogenous structure 500 comprises p-type block 540, LED junction 530, n-type block 520, tunnel junction 510.

In one or more embodiments p-type section 540 comprises a superlattice of semiconductor materials doped to have holes as majority carriers. N-type section 520 comprises a superlattice of semiconductor materials doped to have electrons as majority carriers. LED junction 530 represents the interface between p-type block 540 and n-type block 520. In an unbiased or reverse biased state, LED junction 530 is a depletion region acting as an insulator. In a forward bias, LED junction become an active region whereby holes and electrons readily combine and emit photons from electron falling from the conduction band to outer valance shell of the proximal atom.

Cascade 550 comprises N heterogenous LED structures pursuant to the preceding description. One skilled in the art will appreciate that hole/electron combinations (and photon emissions) increase linearly with N for any given current up to saturation.

The advantage of the cascade is that because the bandgap is narrowed from the superlattice, the voltage necessary to forward bias the LED becomes nominal. Consequently, numerous LEDs can be wired in series thereby efficiently using both the voltage and current.

Specifically, each cascaded stage is separated by a tunnel junction thereby ensuring that the electron/hole has potential to produce a photon at each stage. For an N-stage system, one gets potentially N-times the photons for each electron/hole injection but the voltage also increases linearly with number of stages. Since each stage has open-circuit voltage of 100-500 meV—depending on the design wavelength of the SL, cascading increases the voltage to a reasonable value of 1.5-10 V.

Figure 6:
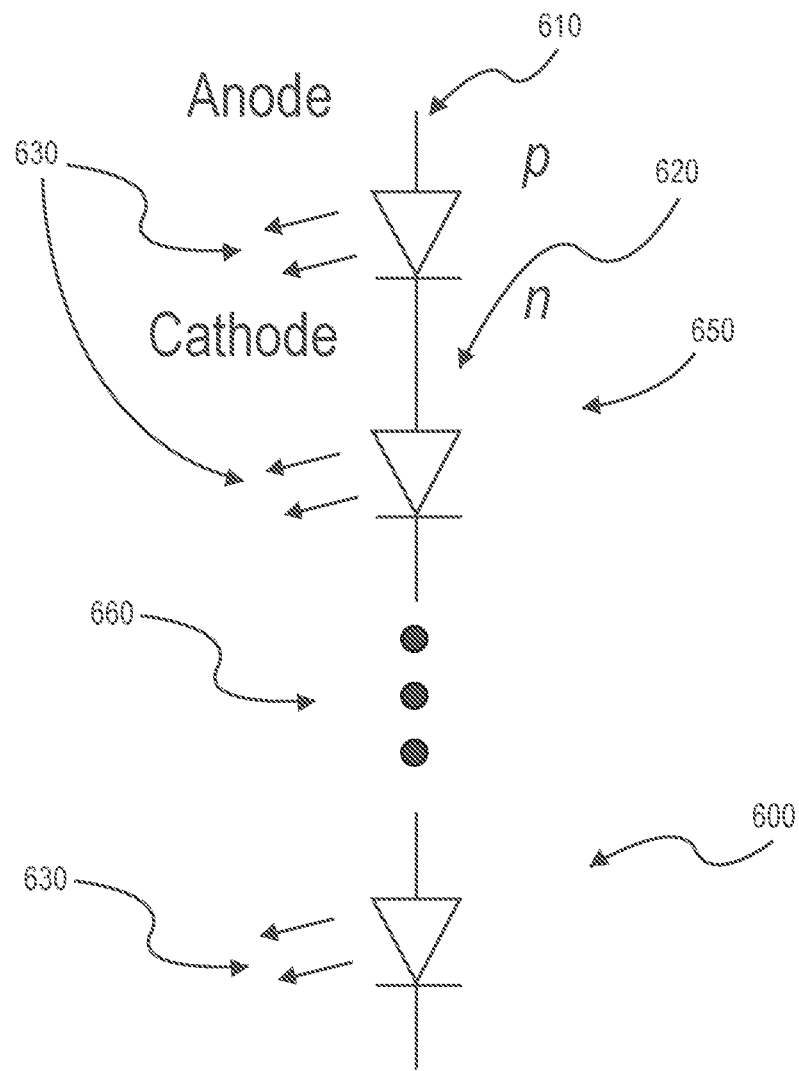
FIG. 6 depicts a circuit diagram of cascaded LEDs, according to one or more embodiments of the present invention.

FIG. 6 depicts a circuit diagram of cascaded LEDs 600, according to one or more embodiments of the present invention. Cascade 600 is the symbolic representation of cascade 500 given in FIG. 5. Cascade 600 comprises anode 610, cathode 620 and N iterations 660 of LED devices. It is noted that cathode 620 is the anode of LED device 650 as the devices are a wired in series. In practice, there is a tunnel junction separating the heterojunctions. Light 630 is emitted from the active layer of the cascade 600.

Figure 7:
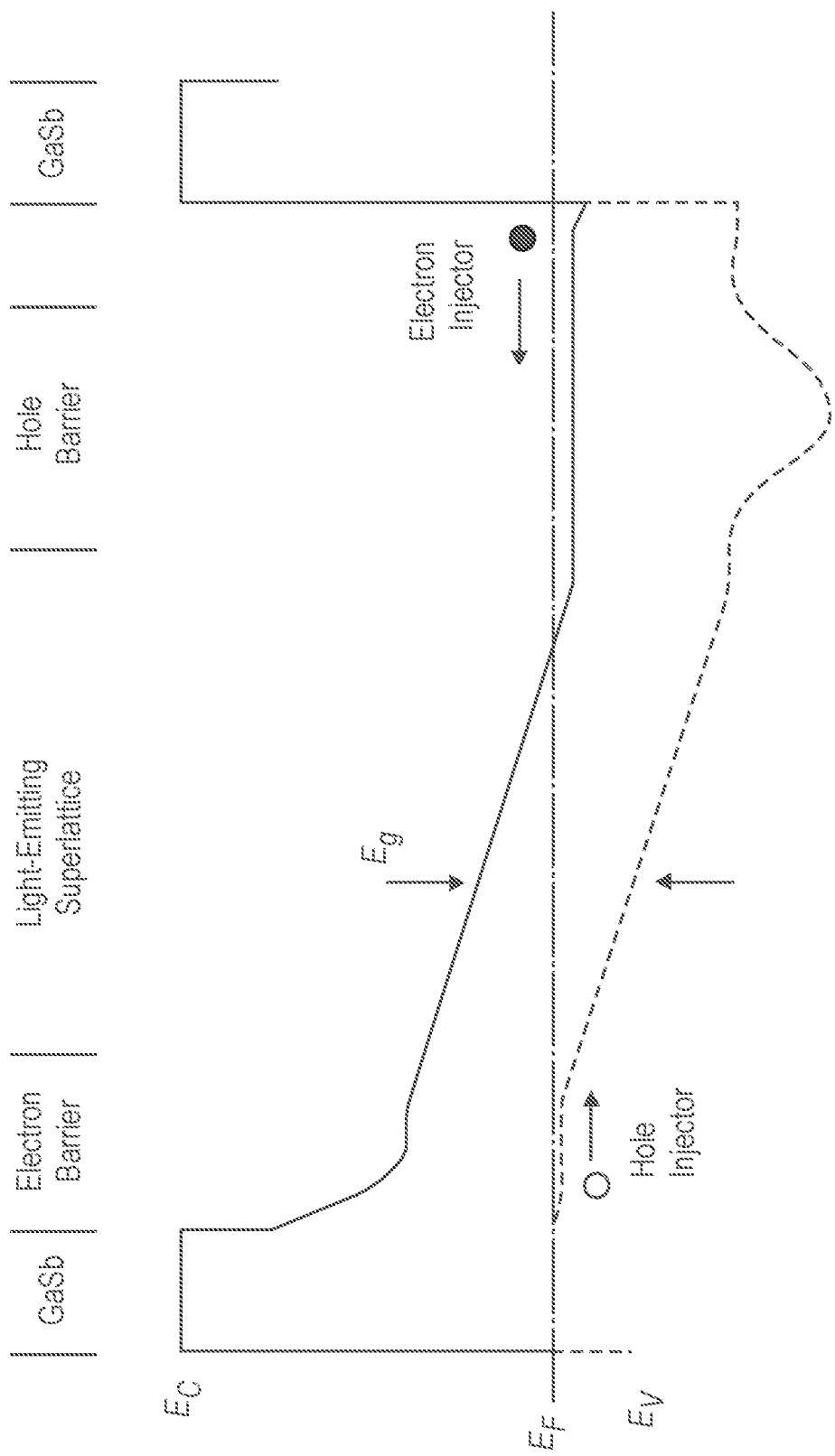
FIG. 7 illustrates another band diagram of electron potential energy versus position through superlattice layers, according to one or more embodiments of the present invention.

FIG. 7 illustrates another band diagram of electron potential energy versus position through superlattice layers, according to one or more embodiments of the present invention. FIG. 7 shows the band diagram for an embodiment of a mid-infrared superlattice LED implemented with InAs—GaSb superlattice heterostructures for electron and hole injectors and for minority carrier confinement barriers. Majority carrier contact superlattices also connect the hole and electron injectors to the respective hole and electron sources. The band diagram shows the conduction and valence band edges of the superlattice bands and a flat Fermi level, $E_F$, corresponding to no applied potential.

Holes are injected into the light emitting superlattice from the left by an embodiment that forms a hole injector in the valence band and a minority electron barrier in the conduction band. The hole injector also includes an embodiment that forms a low-resistance electrical contact to p-type GaSb, which supplies the holes.

In one or more embodiments, electrons are injected into the light emitting superlattice from the right by an embodiment which forms an electron injector in the conduction band and a minority hole barrier in the valence band. The electron injector is connected with an embodiment that uses an n-type graded superlattice to electrically connect the injector with an embodiment of a band-to-band tunneling contact which supplies the electrons.

Figure 8:
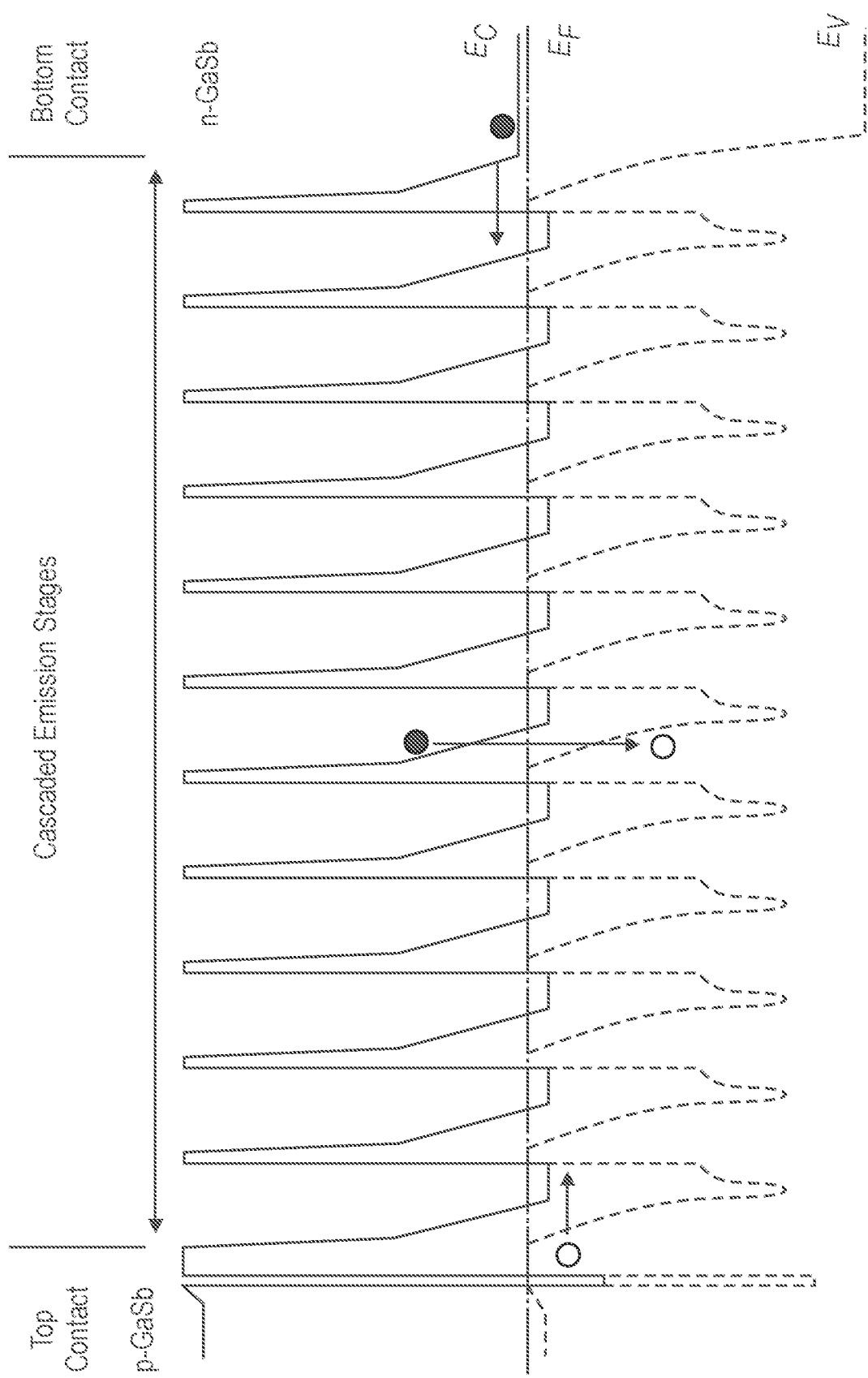
FIG. 8 illustrates another band diagram of electron potential energy versus position through superlattice layers, according to one or more embodiments of the present invention.

FIG. 8 illustrates another band diagram of electron potential energy versus position through superlattice layers, according to one or more embodiments of the present invention.

FIGS. 5 and 6 give two representations of a cascaded LED with N cascaded emission stages, displaying an equivalent circuit diagram for the cascade of light emitting pn-diode junctions. The doped superlattice heterostructures of the embodiments disclosed herein are depicted in the band diagram of FIG. 8, which shows 12 cascaded LED junctions. This example embodiment is implemented with InAs—GaSb superlattice heterostructures for light emission, confinement, contacting and tunneling. Electron flow is to the left from the n-type GaSb on the right through the cascade, and the hole flow is to the right from the p-type GaSb on the left.

FIG. 9 shows an exemplary light emitting diode (LED) 900, according the present state of the art. LED 900 comprises top bond wire 910, surface grating/metal contact 920, active layers 930, LED die 950, back contact mirror 940, substrate 950 and submount metal 960.

FIG. 9 depicts a cross-sectional view of a representative bonding and packaging configuration as described in more detail to follow. In at least one embodiment, the bonding and packaging configuration may be for a top-side emitting LED 900 for wavelengths $\lambda_O$ from about 3 to 15 μm. One will understand that the figures depicted and described herein are for explanation and clarity only and are not meant to limit the invention to any particular configuration or embodiment.

FIG. 9 illustrates front side bond pad and current spreading structures, e.g., surface grating/metal contact 920. Additionally, the bond pad, current spreading structures, and surface gratings are all closer to the active layers or epitaxial layers. Another aspect of the present disclosure is that back contact metal 960 mounted on a substrate to carry to provide electrical connection and carry heat.

With respect to bond pad and current spreading structures, the current spreading structure consists of two parts: a network of metal lines emanating from the bond pad and a highly doped epitaxial layer just below the metal lines to further spread the current uniformly across the entire area. FIG. 9, the state of the art, as well as most available LED's use some network of metal lines. This is crucial to the operation of the device in an efficient fashion. The doped, semiconductor current spreading layer is part of the design of the LED. At any rate, these two parts that form the current spreading structure play a very important role in proper and efficient device operation. The significance of while will now be discussed in greater detail.

Electron-hole (e-h) pairs are generated wherever there is current flow. It is these electron-hole pairs that when they recombine, either produce photons or generate heat (phonons). In most of these devices, higher current density favors higher fractional generation of photons up till the optimum. Beyond that optimum point, Auger recombination again becomes dominant and optical efficiency drops. Auger recombination is a non-radiative process where the excess energy from the electron-hole recombination is transferred to electrons or holes that are subsequently excited to higher energy states within the same band instead of giving off photons (the radiative process).

However, the electron-hole pairs generated directly under metal lines also produce photons under the metal lines. These photons have low escape probability. A photon generated right underneath bond pad, will reach a patterned surface grating at high angles of incidence and again will likely be scattered into the substrate with high probability. In general, these photons have low probability of contributing to the extracted light.

A highly doped layer under the metal lines that spreads the current uniformly would provide electron-hole pair generation in the region not covered by metal lines. The uniformity of the current injection depends on the metal network as well as conductivity of the highly doped layer. But in the 3-15 µm region, free carriers can contribute substantially to the light absorption. This free-carrier absorption (FCA) increases as square of the wavelength of photon. Thus, increasing conductivity, which improves uniformity of injection, may also decrease extracted photon yield as some of them will be absorbed by the highly doped layer. Thus, a designed must balance need for uniform current injection—and away from metal lines—with photon absorption.

The inventor of the present disclosure has recognized that a high conductivity spreading layer would be beneficial. This is usually accomplished by doping the semiconductor. But as the conductivity increases with the increased doping, free carrier absorption becomes significant—especially in the mid-wave and long wave IR region.

Thus, it is very difficult to maintain uniform and optimal current density throughout the epitaxial volume and very careful trade-offs must be made between current carrying capacity of thin conductors, its obscuration, surface grating structures, and manufacturing rules.

While these superlattice LEDs can have high internal quantum efficiencies, the external quantum efficiency is quite low. This is due to the substantial number of trade offs are required to balance current injection, current spreading, optical absorption, and heat removal. As a result, most available LEDs have low electrical to optical efficiency.

This usually means that for certain external optical power necessary to operate infrared sensors, one needs to inject large currents into the LED. This results in increased heating of the LED junction, further lowering the efficiency of the LED. This makes managing heat flow and keeping junction temperature rise as low as possible during electrical pumping critical to the superior performance of the LED and often forces one to use a larger area LED to reduce heat production per unit area. From the basic physics of these devices, junction temperature also changes the emission wavelength and emission width. Thus, during electrical pumping of these devices, there is a transient change in the emission efficiency, wavelength shift, and broadening, all occurring simultaneously.

Changing electrical pumping parameters such as current amplitude or pulse width can have complex impact on LED emission profiles (evolution of intensity and wavelength) as diffusion of heat occurs on timescale driven by the substrate thickness and heat conduction to the sub-mount.

The above discussion shows that the patterned surface grating, current spreading structures, and method of mounting all affect the performance.

The ideas discussed above are generally true of all LEDs but become particularly relevant to superlattice LEDs due to lower optical efficiency resulting in large production of heat. That said, the inventor of the current disclosure simply used a structure similar to that depicted in FIG. 9 as a clear illustration of the challenges required to be met to manufacture a high-performance LED's necessary for IR sensors.

Figure 10:
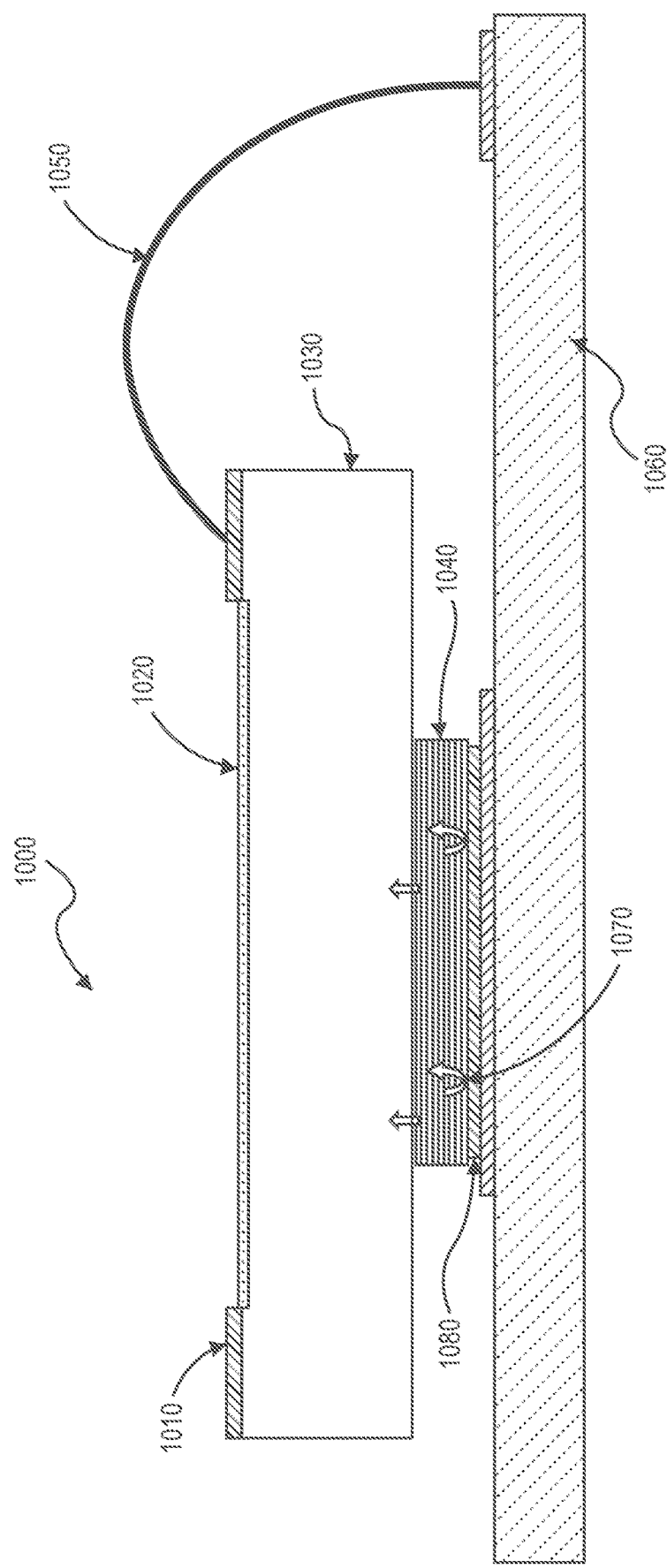
FIG. 10 depicts the sideview of an exemplary superlattice LED and/or photodetector with better electrode geometry, according to one or more embodiments of the present invention.

FIG. 10 depicts the sideview of an exemplary superlattice LED 1000 and/or photodetector with better electrode geometry, according to one or more embodiments of the present invention. Superlattice LED comprises ring electrode 1010, light emission surface 1020, bond wire 1050, epitaxial growth substrate 1030, superlattice heterostructure with tunnel junctions 1040, epitaxial covering metal electrode 1080 and PCB/laminate submount substrate 1060.

FIG. 10 is one of the preferred embodiments of this invention disclosure that improves the performance of these IR LEDs along all of these dimensions: (1) improved junction temperature control, (2) guaranteed highly uniform current pumping, (3) ability to maintain optimal electron-hole pair generation density throughout the volume of epitaxial layers, (4) lower absorption from doped layer contacting the metal, and (5) separation of current injection and optical extraction surfaces to allow optimization of each separately.

In FIG. 10, the epitaxial layers are completely covered (or substantially in other embodiments) by metal by epitaxial covering metal electrode 1080 on PCB/laminate submount substrate 1060. Some generated photons 1070 are reflected off the metal electrode 1080 and directed towards the light emission surface 1020. In one or more embodiments, PCB/laminate submount substrate 1060 is a printed circuit board (PCB), laminate or sub-mount substrate that provides electrical connections and mechanical support. It can further include a conductive support layer disposed between PCB and metal electrode 1080 which is useful in electronic connectivity (PCB trace wiring), structure support, and heat dissipation.

On the substrate-side, a ring electrode 1010 forms the current injection structure leaving the center of the substrate free of any metallization. Furthermore, these epitaxial structures are shown to form a mesa that is slightly smaller than the size of the LED for ease of dicing or cleaving of LEDs. It also allows for side-wall passivation, which is more important to the operation of LED as photodiode. While depicted, the operation of the structure disclosed herein does not depend on having a mesa structure, it may extend all the way to the edge.

Simulations show that for reasonable combination of thickness of the substrate and conductivity, one can achieve a uniform vertical current flow through the entire epitaxial region. It is noted that the substrate is much thicker than the epitaxial layers. Typical epitaxial thickness is of the order of few microns while substrate may be 100's of micron thick. A ring electrode on the substrate-side will spread the current uniformly (as substrate is much thicker) and leave the central region completely open for light emission.

Since most of the heat is generated in the epitaxial layer, high metal coverage and extreme proximity to sub-mount provides very efficient heat flow and control of the junction temperature. Furthermore, there is really no need for a highly doped layer to spread current—just doped to make a good ohmic contact with the metal. In general, this will reduce the series resistance and thus lower the voltage as well as reduce heat production.

Thus, the embodiment shown in FIG. 10 results in: (1) better heat control and junction temperature stability, (2) optimal electron-hole pair generation throughout the volume due to uniform current injection further lowering of resulting heat generation and higher electrical-to optical efficiency, and (3) optical reflection from the very nearby metal allowing all the photons going towards the metal to be redirected towards opposite optical extraction surface unencumbered by the metallic electrodes.

In an LED described in association with FIG. 9, since the light is extracted from the front side, the electric field at the semiconductor-air or semiconductor-lower index medium interface will be high. For the photons undergoing total internal reflection, the electric field at the interface will be maximum.

This follows from the Fresnel's laws of refraction and reflection at the boundary of two materials of different refractive indices. This means that the doped layer near the metal spreading layer will provide enhanced absorption as the absorption is proportional to the square of the electric field. In the invention of FIG. 10, the presence of metal surface implies that the electric filed is very close to zero at the metal interface. Thus, there is very little electric field at the boundary and even the same doped layer would produce small absorption.

Figure 11:
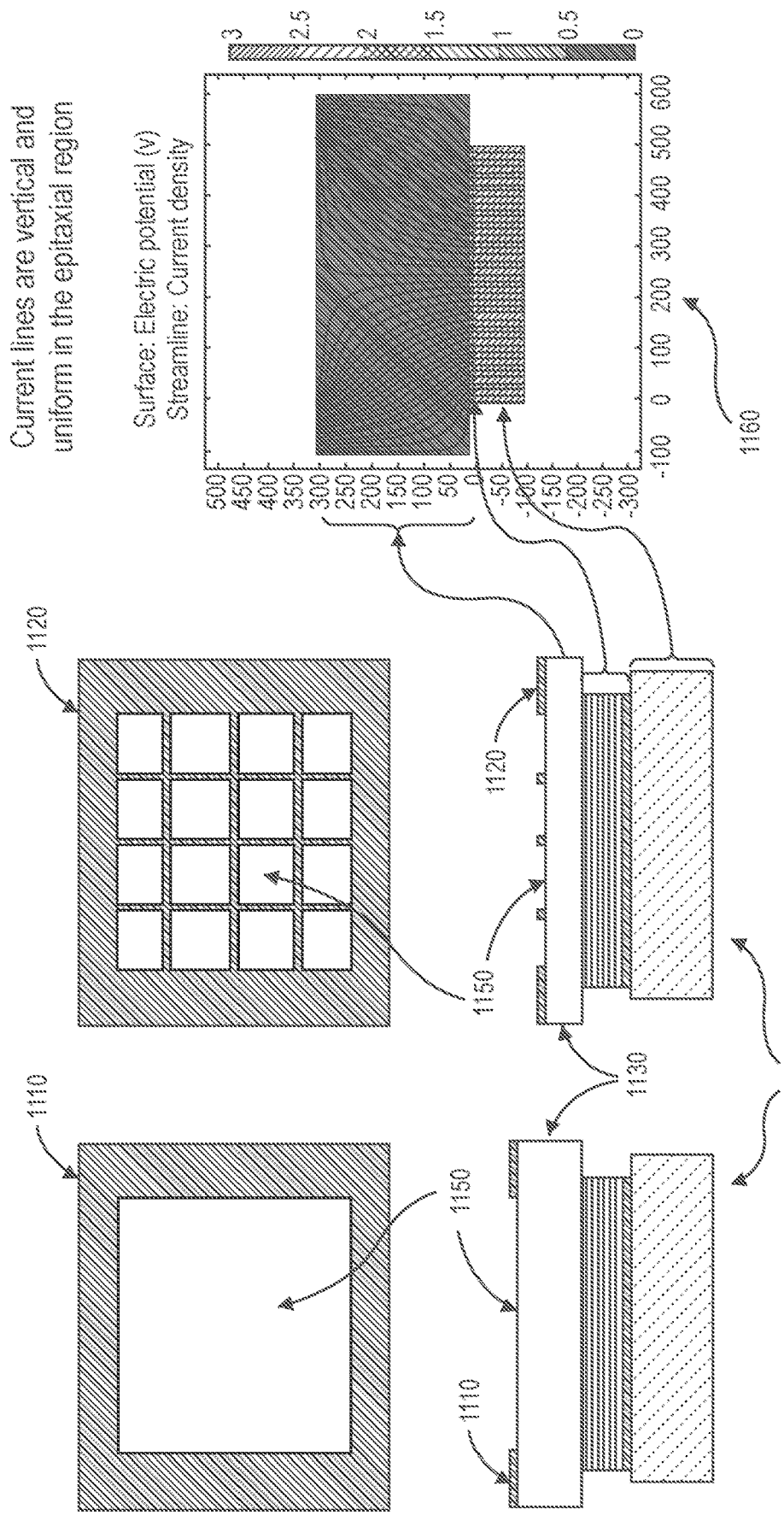
FIG. 11 depicts a light emitting diode with exemplary bond pads with top view and side cross-sections of substrate electrode, according to one or more embodiments of the present invention.

This is illustrated in FIG. 11. FIG. 11 depicts a light emitting diode 1100 with exemplary bond pads with top view and side cross-sections of substrate electrodes 1110, 1120, according to one or more embodiments of the present invention.

This effect can be substantial. For example, at 10 μm, $10^{19}$ doped InAs layer would have absorption of 500-5000 cm$^{-1}$ depending on the defect density and quality of the film. Assuming a value of 1000 cm$^{-1}$, this would mean that a 100 nm thick spreading layer would generate 8% loss from reflection while the same layer near the metal would generate barely perceptible loss of <0.1%.

It is important, to remember that the effective resistance of the spreading layer would be proportional to its thickness t and doping N. The same would also apply to the optical loss so reducing the resistance would necessarily increase the optical loss in a typical frontside emitting designs. In our backside emitting design, we suppress this optical loss and reduce the contact resistance.

The substantial drop in thermal resistance from the epitaxial layers to the sub-mount—which is now immediately touching the sub-mount—provides significant improvement in the thermal performance by decreasing the rise in the junction temperature. Let us assume that the substrate has thickness h, and has thermal conductivity of GaSb ~32 W/m/K. The epitaxial layers are<few microns thick and all the metallization may be at best another few microns. For small total heat generation, we may consider sub-mount to be an infinite heat sink.

We estimate the thermal resistance to be roughly:

$$\theta_{epimetal} \gtrsim \frac{10\ \mu m}{\kappa_{Au} A_{led}} \sim 0.1\ K/W \quad (1)$$

Thus, even a 5-10 W of electrical pumping will raise the junction temperature by only a few Kelvin. Furthermore, the thermal timescales for heat transfer are far shorter than the duration of typical current pulses of 10's to 100's of microseconds making the entire current pulse producing a smaller and more uniform temperature rise.

In case of typical front side emitting LED shown in FIG. 1, the thermal resistance may be estimated to be:

$$\Theta_{subs}^{frontside} \sim \frac{h}{\kappa_{GaSb} A_{led}} \quad (2)$$

This can be estimated to be roughly 10-20 K/W for a 0.5 mm square LED with h ~100 μm. The thermal resistance of the bond wire is high (>1000 k/W) and thus can be ignored. Thus, all the heat is removed via the substrate. This implies change in junction temperature rise of ~100 K. Note that this is a rough estimate as the thermal time constants in this case are comparable to the pulse width of the current pulse. Thus, a complex transient will be present in the LED emission profile during the current pulse making it very difficult to compare data taken a different electrical pump level.

Electrodes 1110, 1120 are coupled to epitaxial substrate 1130 function to uniformly spread current evenly over and throughout the active layers. Current densities are graphed with electronic potential in graph 1160.

In some cases, especially if the substrate is thinned, one might find that the current may not spread uniformly from the ring into the epitaxial layers. This can be easily mitigated by doping the surface of the substrate to provide current spreading at the surface, or even running thin metal lines across the substrate. Very few metal lines are necessary and they can be quite thin as the thickness of the substrate helps in spreading the current. The impact of these metal lines is very low to the optical performance as they are far from the optical emission region.

Figure 12:
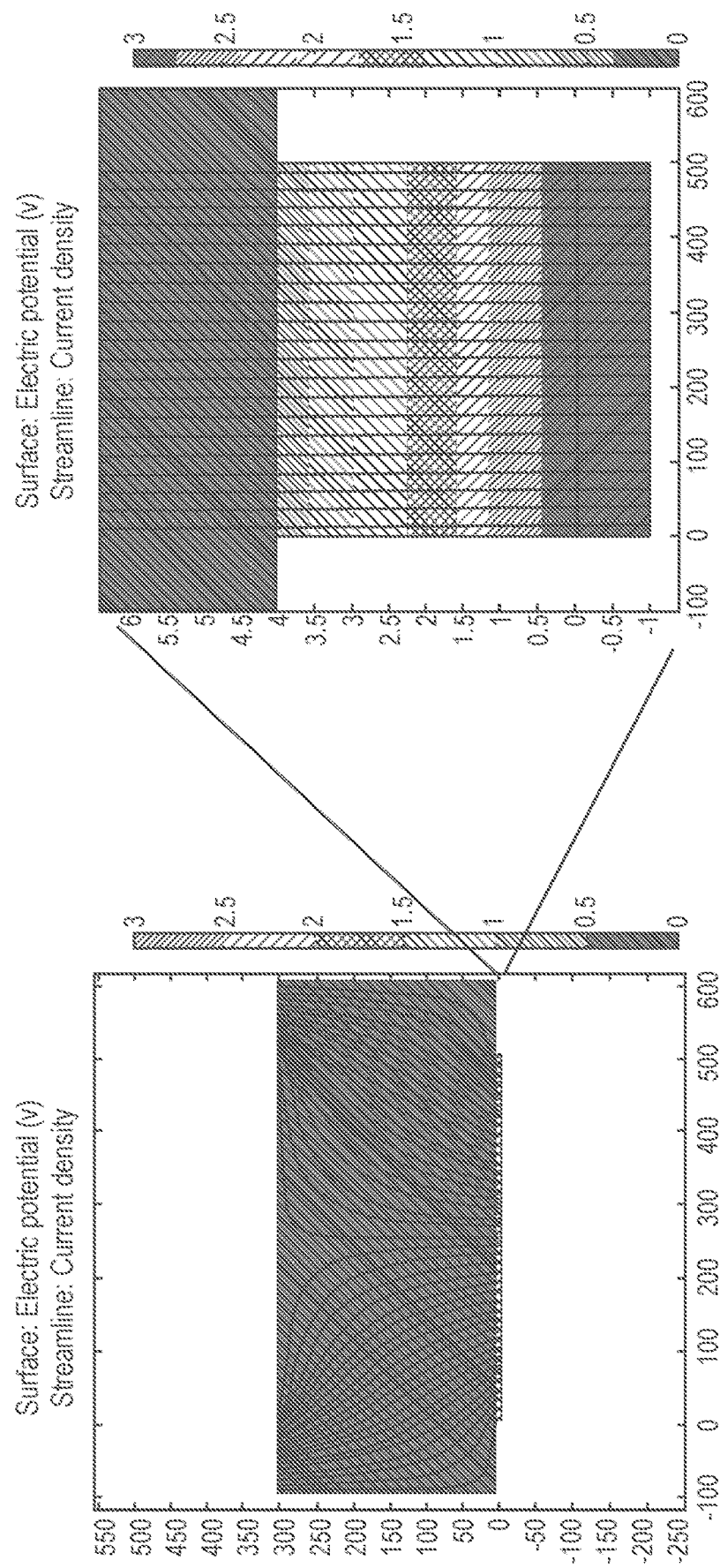
FIG. 12 illustrates an exemplary doping profile for a light emitting diode on a substrate demonstrating current pumping is uniform throughout epitaxial region, according to one or more embodiments of the present invention.

This is shown in FIG. 12. FIG. 12 illustrates an exemplary doping profile for a light emitting diode on a substrate demonstrating current pumping is uniform throughout epitaxial region, according to one or more embodiments of the present invention.

Simulations on the current spreading from the substrate to the epitaxial region shows that for current pumping remains uniform in the epitaxial region. This uniform pumping can be maintained for any combination of substrate conductivity (determined by the doping level) and its thickness. The two cases amongst hundreds of possible combinations are shown in FIGS. 13 and 14.

Figure 13:
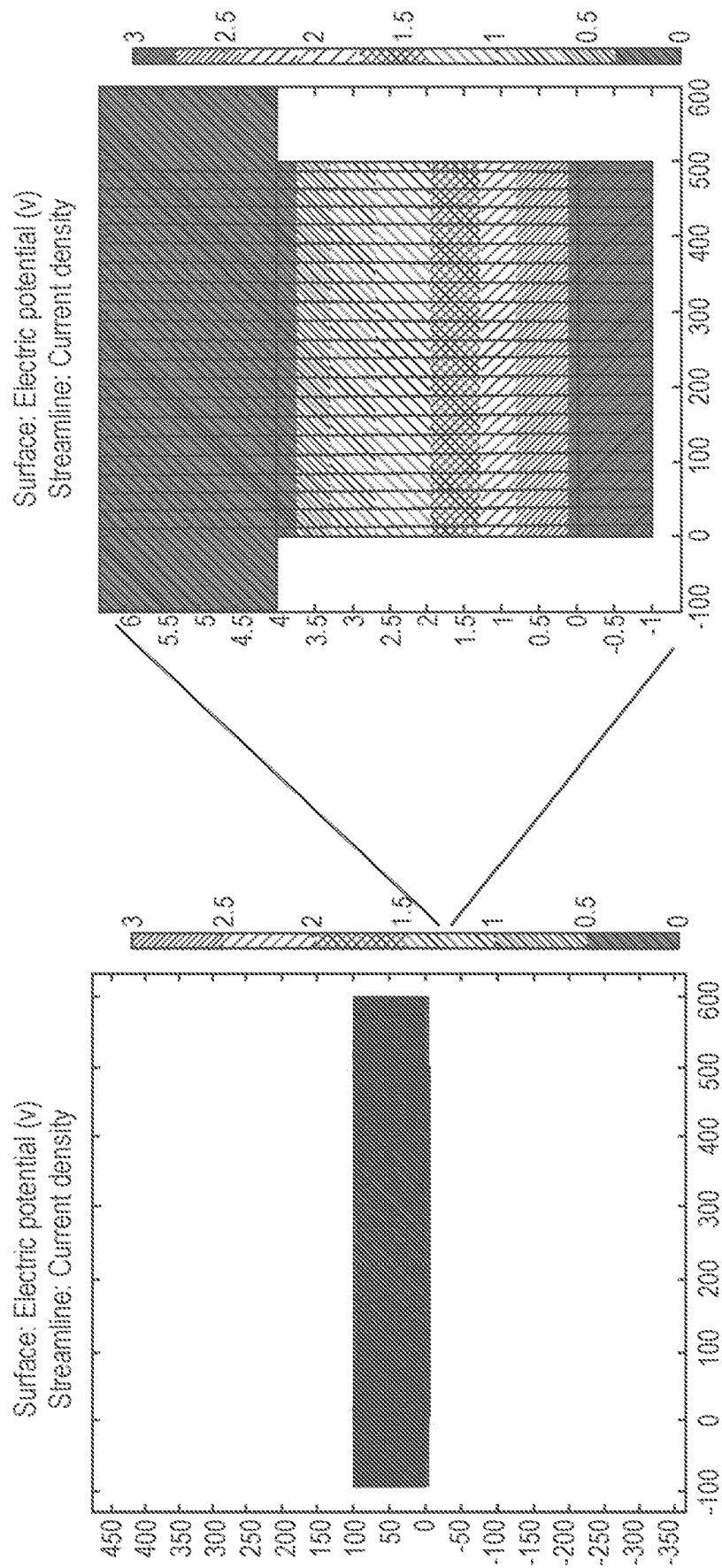
FIG. 13 illustrates an exemplary doping profile for a light emitting diode on a substrate demonstrating current pumping is uniform throughout epitaxial region, according to one or more embodiments of the present invention.

FIG. 13 illustrates an exemplary doping profile for a light emitting diode on a substrate demonstrating current pumping is uniform throughout epitaxial region, according to one or more embodiments of the present invention.

Figure 14:
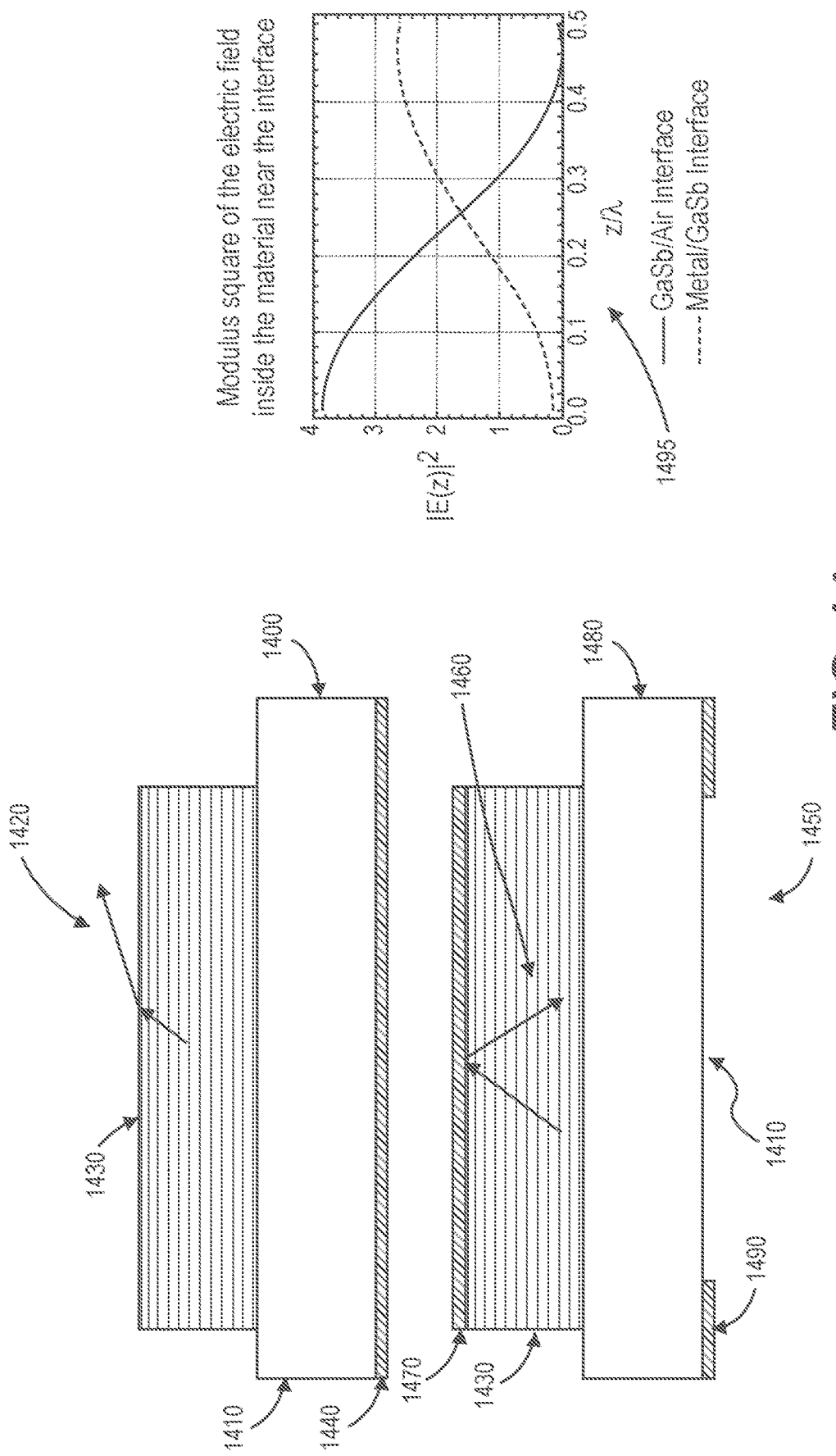
FIG. 14 illustrates an exemplary light emitting diode on a substrate demonstrating current spreading layer and optical loss, according to one or more embodiments of the present invention.

FIG. 14 illustrates an exemplary light emitting diodes on a substrate demonstrating current spreading layer and optical loss, according to one or more embodiments of the present invention. Traditional LED 1400 design comprises epitaxial material 1430 having an index of refraction of approximately 3.5. Incident light 1420 and transmission at the air/epitaxial material 1430 boundary can be seen. A metalized backing 1440 on the bottom of the substrate 1410 reflects photons up back through the epitaxial material 1430.

In one or more embodiments, LED 1410 comprises substrate 1480, ring electrode 1490, epitaxial material 1430 and metal electrode 1470 which reflects light 1460 back though substrate 1480.

The surface of the central light-emitting region on the substrate can be modified to provide various optical functions depending on the system needs without interfering with current injecting structures. These include: (1) anti-reflection coatings, (2) optical filter coatings to provide emission from only the wavelengths of interest directly deposited on the LED, (3) surface gratings including random surfaces for higher light extraction, (4) micro-lens array for even more efficient light extraction with AR coatings, and (5) bonding to other substrates that may have complex electrical and optical surfaces. These modifications are shown in subsequent figures.

Graph 1495 shows modulus square of the electric field inside the material near the interface. GaSb/air interface is shown in solid line, while the Metal/GaSb interface is depicted in dashed line. Quite often the semiconductor near the contact is heavily doped to reduce contact resistance and form a good ohmic contact. But heavy doping also leads to loss of light due to free-carrier absorption. This becomes particularly important as wavelength increases since it increases as at least as the square of the wavelength.

By having a low electric field near the contact region containing heavily doped semiconductor, the loss is automatically reduced. Thus, at the interface 1470, the losses are reduced, and at the interface 1410, where the light is emitted, one does not require heavy doping for good electrical contacts as these form ring 1490.

Figure 15:
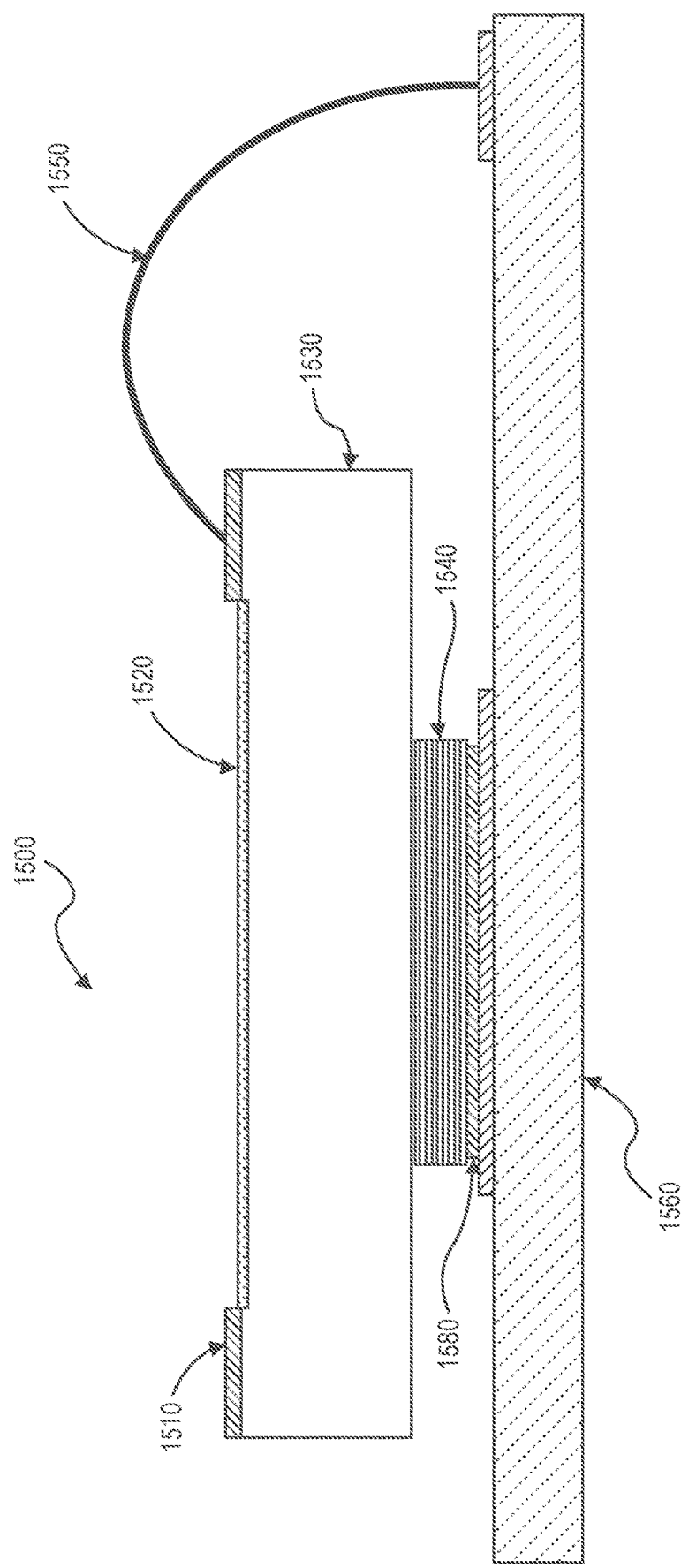
FIG. 15 depicts an exemplary superlattice LED and/or photodetector with better electrode geometry, according to one or more embodiments of the present invention.

FIG. 15 depicts an exemplary superlattice LED 1500 and/or photodetector with better electrode geometry, according to one or more embodiments of the present invention. Superlattice LED 1500 comprises ring electrode 1510, light emission surface 1520, bond wire 1550, epitaxial growth substrate 1530, superlattice heterostructure with tunnel junctions 1040, epitaxial covering metal electrode 1580, anti-reflective/optical filter coating 1520 and PCB/laminate submount substrate 1560.

FIG. 15 shows a planar surface of the substrate simply coated with anti-reflection (AR) coating or an optical filter coating. In this case light extraction efficiency is simply given by the critical angle for total internal reflection. Due to two-passes, and ignoring absorption, extracted light is given by $$\frac{1}{2}\left(\frac{1}{n^2}\right),$$

where n is the refractive index of epitaxial layers. This for GaSb is ~4%.

Figure 16:
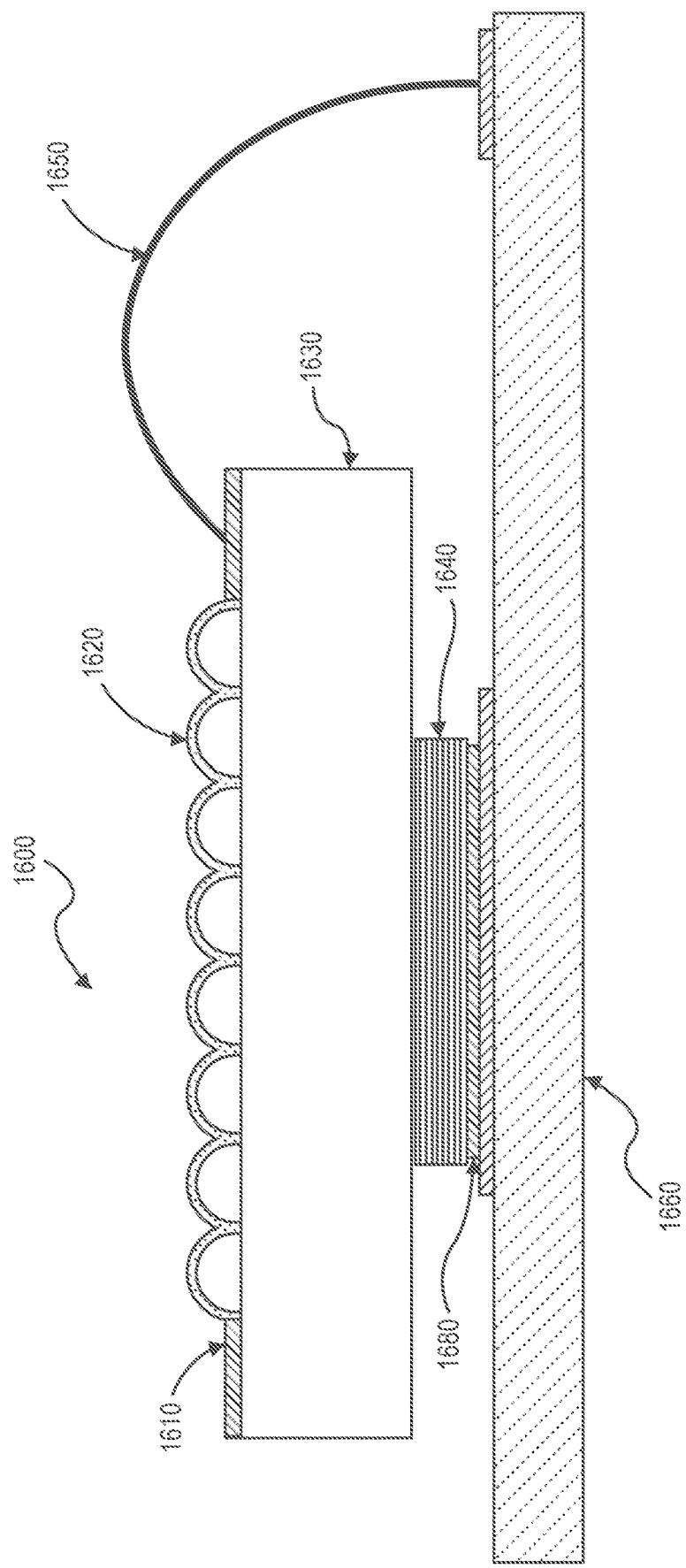
FIG. 16 depicts an exemplary superlattice LED and/or photodetector with better electrode and mechanical geometry, according to one or more embodiments of the present invention.

FIG. 16 depicts an exemplary superlattice LED and/or photodetector with better electrode and mechanical geometry, according to one or more embodiments of the present invention. Superlattice LED 1600 comprises ring electrode 1610, light emission surface 1620, bond wire 1650, epitaxial growth substrate 1630, superlattice heterostructure with tunnel junctions 1640, epitaxial covering metal electrode 1680, anti-reflective/optical filter coated micro-lenses 1620 and PCB/laminate submount substrate 1660.

Figure 17:
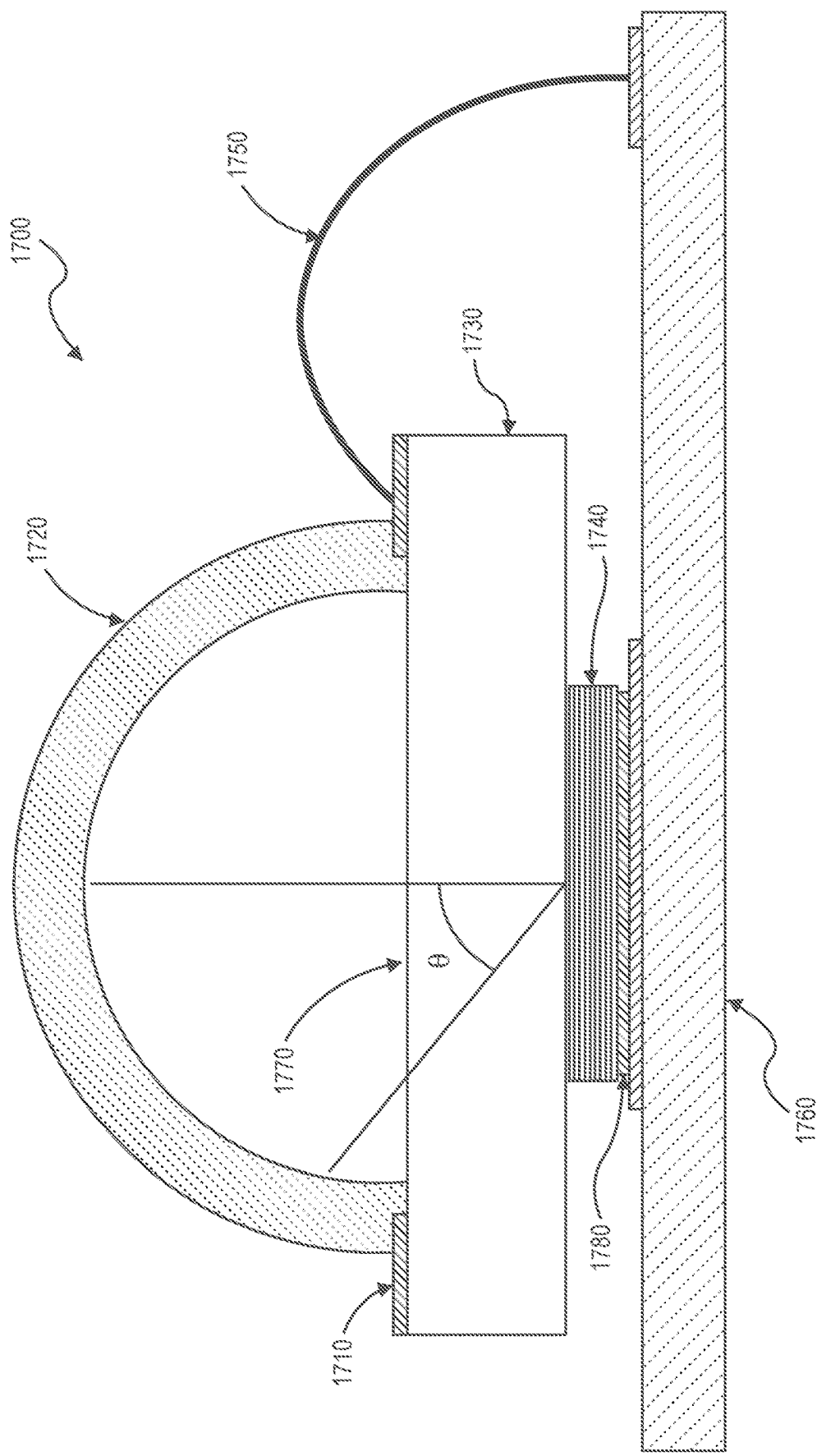
FIG. 17 depicts an exemplary superlattice LED and/or photodetector with better electrode and mechanical geometry, according to one or more embodiments of the present invention.

FIGS. 16 and 17 show micro lenses or a single lens for an improved light extraction. A single lens shown in FIG. 17 with refractive index of 1.6 on GaSb ($n_{GaSb}$ ~3.6) can provide extraction proportional to ½sin (θ)² which may be as high as 25%. Furthermore, by optimizing the size of epitaxial mesa, one can increase the brightness of the LED as the lens will collimate the rays emanating from the epitaxial region. In this case, having light emission from the substrate side is critical to the operation of the lens as one needs distance roughly equal to the focal length from the light emission region.

FIG. 17 depicts an exemplary superlattice LED and/or photodetector with better electrode and mechanical geometry, according to one or more embodiments of the present invention. Superlattice LED 1700 comprises ring electrode 1710, light emission surface 1720, bond wire 1750, epitaxial growth substrate 1630, superlattice heterostructure with tunnel junctions 1740, epitaxial covering metal electrode 1780, anti reflective/optical filter coated macro-lens 1720 and PCB/laminate submount substrate 1760.

Note that aspects of FIG. 16 and FIG. 17 can be easily combined to provide both filtering and collimation, in one or more embodiments. A collimated, optically filtered LED light emission is particularly advantageous to the differential path length absorption measurements.

Figure 18:
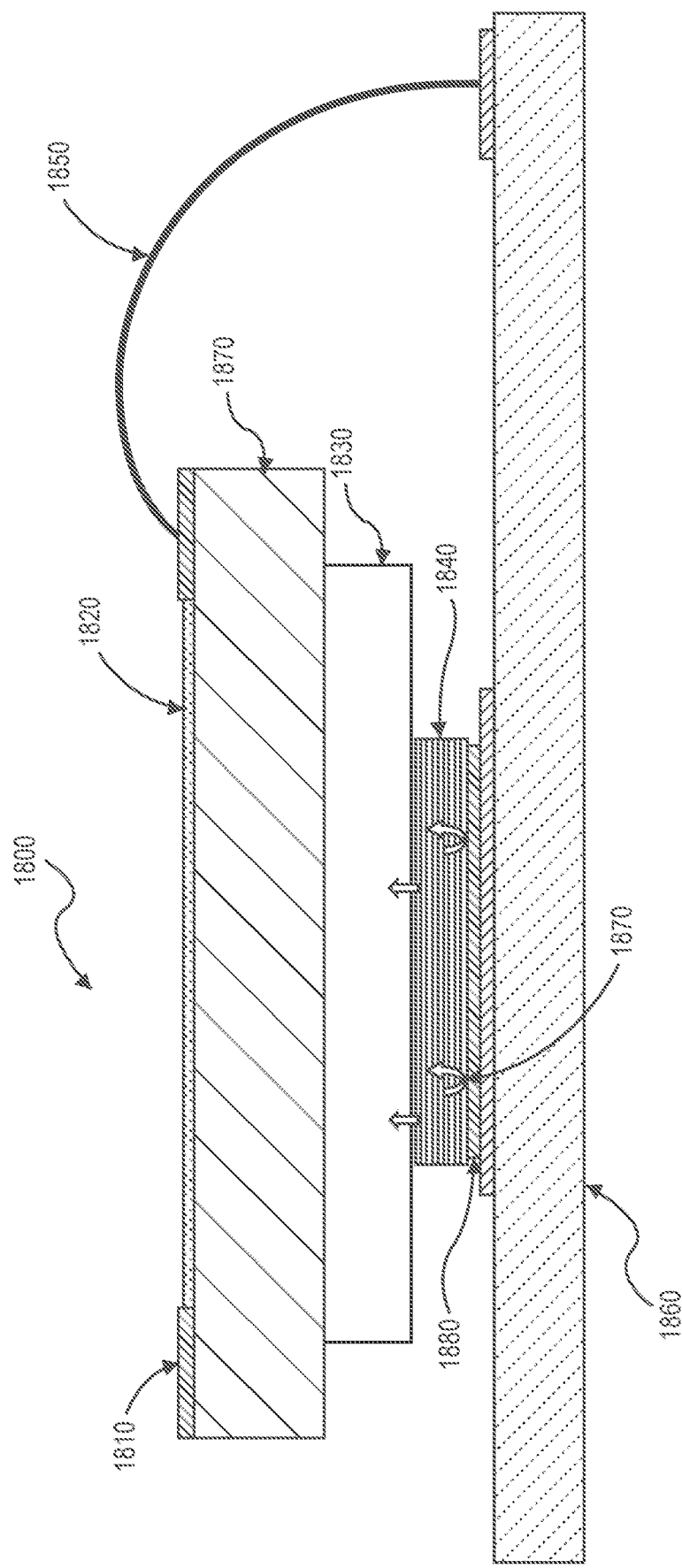
FIG. 18 depicts an exemplary superlattice LED and/or photodetector with better electrode geometry, according to one or more embodiments of the present invention.

FIG. 18 depicts an exemplary superlattice LED and/or photodetector with better electrode geometry, according to one or more embodiments of the present invention. Superlattice LED 1800 comprises ring electrode 1810, light emission surface 1820, bond wire 1850, epitaxial growth substrate 1830, superlattice heterostructure with tunnel junctions 1840, epitaxial covering metal electrode 1880, light emission surface 1820, current spreading/optical control substrate 1870 and PCB/laminate submount substrate 1860. Some generated photons 1870 are reflected off the metal electrode 1880 and directed towards the light emission surface 1820.

FIG. 18 shows, LED with its substrate bonded to yet another substrate (e.g., 1870) such as Silicon. In the case of silicon, it will provide not only electrical connection but a functional optical surface with lenses or coatings or gratings depending on the need. The optical surface fabrication is far more mature in silicon than in more exotic materials such as GaSb and GaAs on which the epitaxial layers for these LED's are grown. Furthermore, since refractive index of silicon is closely matched to that of GaSb or GaAs, more light can be extracted into the silicon (there is no total internal reflection). Surface gratings and micro-lens array etc. can then further efficiently extract this light for emission. The size of these two substrates need not be same.

The single mesa structure of epitaxial layers shown in FIG. 11 may also be divided into multiple mesa structures.

Since these LEDs are often used as photodiodes (PD), the above embodiment also improves photodiode performance. It provides unobscured central-portion of the die for light focusing and the bottom metallized electrode provides double pass for the photons to double absorption length. Continuous, low resistance electrode also leads to efficient electron-hole pair collection as metal contacts are always very close and requires no lateral diffusive transport. All the figures shown for the LED apply to the photodetector as one can simply imagine reversing all the light rays.

Figure 19:
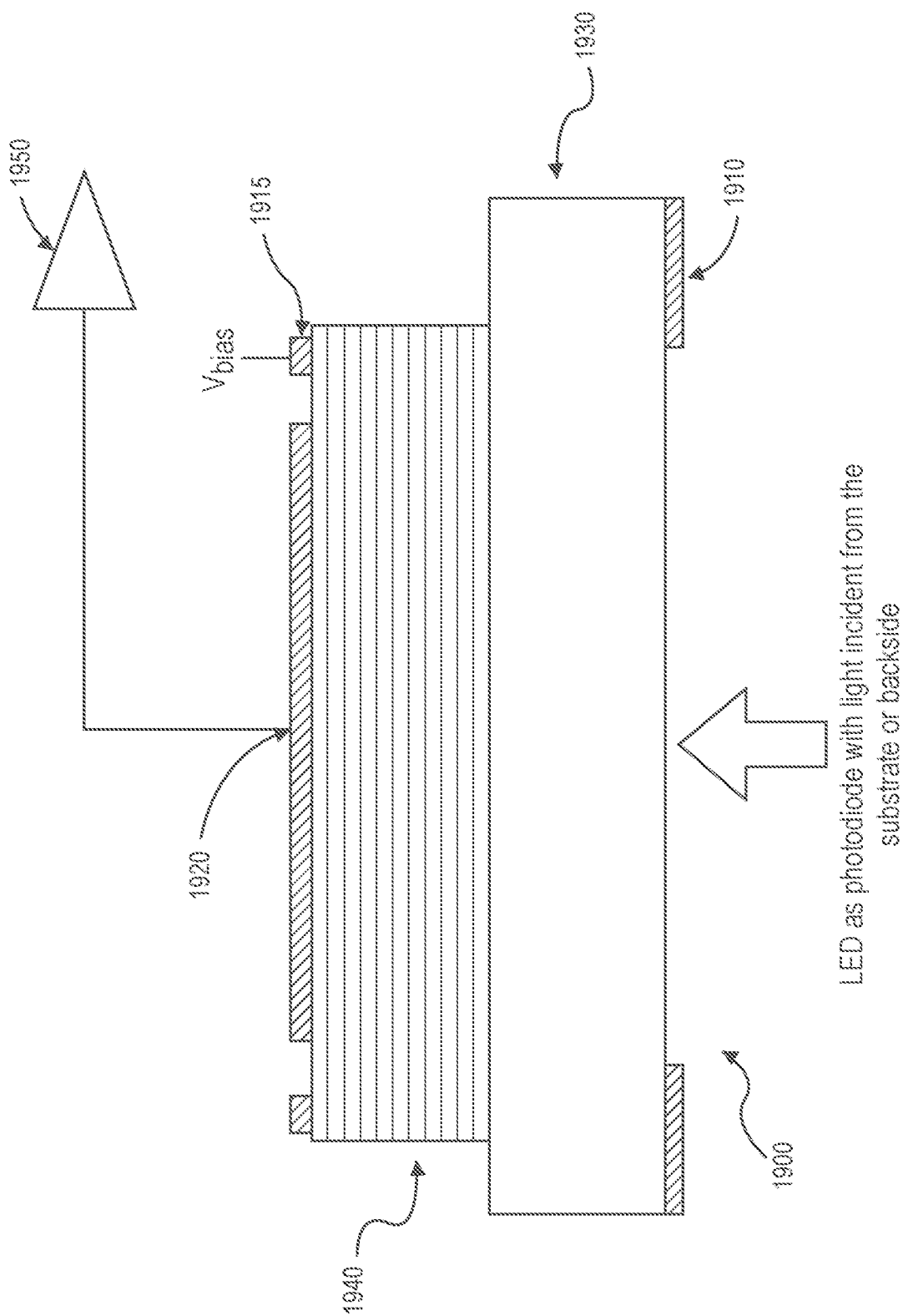
FIG. 19 illustrates aspects an exemplary light emitting diode including LED being used as a photodetector according to one or more embodiments of the present invention; and, FIG. 20 depicts an exemplary resonant cavity light emitting diode, according to one or more embodiments of the present invention.

FIG. 19 illustrates aspects an exemplary light emitting diode including LED being used as a photodetector 1900 according to one or more embodiments of the present invention. Photodetector 1900 comprises central electrode 1920, bias electrode 1915, amplifier 1950, heterogenous structure 1940, ring electrode 1910 and substrate 1930.

Amplifier 1950, set at bias voltage $V_{bias}$, measures the photocurrent from the central electrode 1920 which collects only the photocurrent.

The photodetector structure may have an additional ring electrode, bias electrode 1915, on the front side connecting the epitaxial layers. This is shown in FIG. 19. This optional additional ring electrode, isolates the edge region from the central region. This can help reduce the leakage current as seen by the photocurrent measuring circuit connected to the central electrode. The sidewall leakage current from poor passivation, etch induced defects etc. is now shunted to the ring electrode. Thus, the effective shunt resistance of the central electrode is much higher.

This directly improves the performance of photodetector by lowering its Johnson noise. Johnson noise is the electronic noise generated by the thermal agitation of the charge carriers (usually the electrons) inside an electrical conductor at equilibrium, which happens regardless of any applied voltage. Thermal noise is present in all electrical circuits, and in sensitive electronic equipment such as radio receivers can drown out weak signals, and can be the limiting factor on sensitivity of an electrical measuring instrument.

Another very important commercial aspect of this disclosure is lowered cost of LED or photodetector. Since current density is uniform in the epitaxial region and maintained close to optimum, LED dimensions can be reduced for the same extracted optical power.

Figure 20:
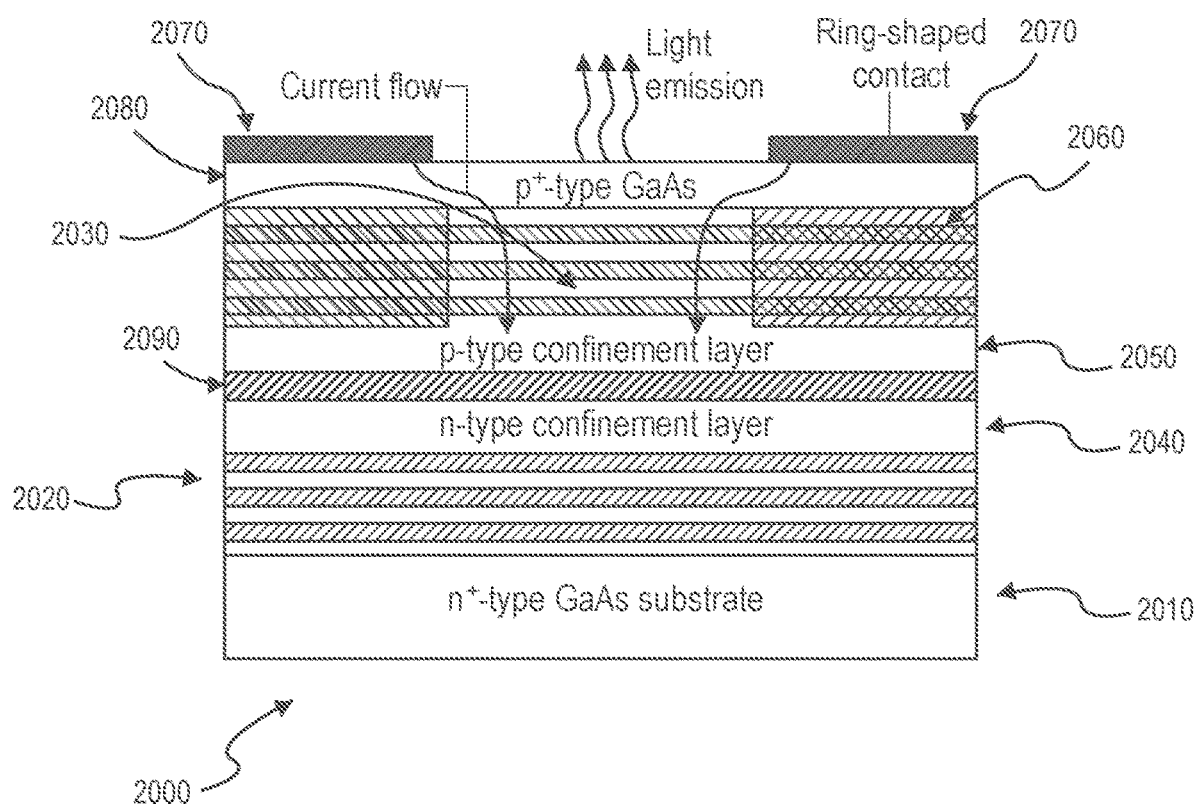

FIG. 20 depicts an exemplary resonant cavity light emitting diode (RCLED) 2000 using one or more superlattices, according to one or more embodiments of the present invention. Resonant cavity light emitting diode 2000 comprises n-type substrate 2010, n-type distributed Bragg reflector (DBR) 2020, n-type confinement layer 2040, multi-quantum well (MQW) active region 2090, p-type confinement layer 2050, p-type distributed Bragg reflector (DBR) 2030, ion-implanted region 2060, and ring-shaped contact 2070.

Light Emitting Diodes (LED's) suffer from poor external quantum efficiencies because most light is coupling to modes confined within the semiconductor. With the use of optically small structures it is possible to channel more tight into the radiation modes thus increasing the quantum efficiency of the device.

One of the most promising methods of improving the LED comes in the form of Resonant Cavity Light Emitting Diode, or RCLED. A planar microcavity changes the fundamental emission properties of the tight emitting material between two planar mirrors. The intensity and spectral purity of emission can be considerably increased over that of a normal LED.

In one or more embodiments, RCLED 2000 comprises InGaAs/GaAs/AlGaAs structures. RCLED 2000 substrate-emitting device comprises a silver back mirror and contact and a strained layer InGaAs multiple quantum well active regions 2090. The output mirror consists of an AlGaAs/GaAs distributed Bragg reflector 2030. These devices exhibit higher intensities on axis at low input current than a perfect internal efficiency conventional LED.

In one or more embodiments, n-type Distributed Bragg reflectors (DBR) 2020 comprises 20-30 n-type AlAs/$Al_xGa_{1-x}As$ quarter wave pairs, while p-type Distributed Bragg reflectors (DBR) 2020 comprises 20-30 p-type AlAs/$Al_xGa_{1-x}As$ quarter wave pairs. However, any Fabry-Perot resonator or vertical cavity surface emitting laser (VCSEL) are not beyond the scope of the present disclosure. As is known in the art, confinements layers act as phase matching layers.

In some embodiments, MQW active region 2090 comprises superlattice structures pursuant to the preceding description. That is, hundreds of epitaxially grown layers having 1-2 nm thicknesses thereby creating minibands. Total thickness of the MQW active region 2090 can be less than 1 μm in some embodiments. Ring-shaped contact 2070 also functions as previously described. Ion-implanted region 2060 acts to deter current flow proximally to ring-shaped contact 2070, which would produce photons wastefully impinging on the metalized surface.

In other embodiments, narrower spectral emission, e.g., operating at 910 nm to 950 nm wavelengths, can be coupled into a fiber results in less chromatic dispersion over longer fiber distances. Such devices are also attractive in optical interconnect applications where high efficiency, low power consumption, and high speed are important.

In numerous embodiments, emission of light through the contact side ("top side") is enhanced due to the highly reflective mirror adjacent to the n-type confinement layer ("bottom side"). Light emission in conventional LEDs is typically close to isotropic. In the RCLED structure, however, the bottom reflector has a higher reflectivity than the top reflector. As a consequence, light propagating along the optical axis of the cavity exits the cavity predominantly through the top (low reflectivity) mirror.

The LED may further include a roughed surface around the absorbing contact. The roughened surface may be included in all or a portion of the surface area of a layer of the base LED structure or in all or a portion of the surface area of an additional layer of material applied to the base LED structure. For example, in an n-side up LED structure having a sufficiently thick n-type layer of material it may be preferable to roughen the n-type layer. In a p-side up base LED structure having a relatively thin layer of p-type material, it may be preferable to add a layer of transparent material to the p-type layer and roughen that layer.

A layer of transparent material may also be added to the n-type layer of an n-side up LED structure. In either case, the combination of a roughened surface and current confinement structure that directs current toward the roughened surface and away from the absorbing contact provides further enhanced light extraction. The roughened surface improves light extraction by providing a varying surface that allows light that would otherwise be trapped in the LED by total internal reflection to escape and contribute to light emission.

Roughened surfaces of light-emitting diodes (LEDs) provide substantial improvement in light extraction efficiency. Other roughening techniques, such as, sodium hydroxide exposure, etching, diffraction gratings, etc. are beyond the scope of the present disclosure.

In other embodiments, a top semitransparent/semi-reflective mirror is disposed on the air/device boundary layer. While in other embodiments, dichroic filters can used for particular purpose such as those on the lenses. Although other optical filters are not beyond the scope of the present invention, such as, interference, absorption, diffraction, grating, Fabry-Perot, etc.

An interference filter consists of multiple thin layers of dielectric material having different refractive indices. There also may be metallic layers. In its broadest meaning, interference filters also comprise etalons that could be implemented as tunable interference filters. Interference filters are wavelength-selective by virtue of the interference effects that take place between the incident and reflected waves at the thin-film boundaries.

Depositions can be performed by, for example, but not limited to: direct metal deposition (DMD); laser metal deposition (LMD), thin-film deposition; chemical solution deposition (CSD), chemical bath deposition (CBD), chemical vapor deposition (CVD), plasma enhanced CVD (PECVD), atomic layer deposition (ALD), molecular layer deposition (MLD), physical vapor deposition (PVD), electroplating and sputtering.

Reflective materials comprised by the mirrored surfaces include, but not limited to: metal, metal alloys, compound metals, semi-conductors, conductive and semi-conductive polymers, conductive and semi-conductive composites, graphene, carbon nanotube, and graphite.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non transitory media.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A semiconductor device having a mesa structure comprising:
   a heterojunction having a bottom side and a top side;
   a support substrate having a top side and a bottom side disposed directly adjacent the top side of the heterojunction;
   an optical substrate having a top side and a bottom side disposed directly adjacent the top side of the support substrate; and
   an electrode forming a current injection structure and configured to:
      substantially cover a perimeter on the top side of the optical substrate;
      define an aperture wherein light passes therethrough; and
      not cover an area over the heterojunction;
   wherein an area of the optical substrate is larger than the heterojunction thereby covering the top side of the heterojunction in its entirety and is substantially transmissive at a predetermined bandwidth associated with a bandgap of the heterojunction.

2. The semiconductor device of claim 1, wherein the heterojunction comprises a superlattice.

3. The semiconductor device of claim 1 further comprising a submount mechanically coupled to the electrode for improved heat flow therethrough.

4. The semiconductor device of claim 3 further comprising a substrate mechanically coupled to the submount.

5. The semiconductor device of claim 4, wherein the substrate is a printed circuit board.

6. The semiconductor device of claim 1 further comprising an optical layer disposed on the top side of the optical substrate.

7. The semiconductor device of claim 6 wherein the optical layer is etched.

8. The semiconductor device of claim 6 wherein the optical layer comprises a diffraction grating.

9. The semiconductor device of claim 6 wherein the optical layer comprises an optical filter.

10. The semiconductor device of claim 6, wherein the optical layer comprises one or more of a micro-lens array, a Fresnel lens, and a macro lens.

11. The semiconductor device of claim 1, wherein the optical substrate comprises semiconductor doping.

12. The semiconductor device of claim 1, wherein the predetermined bandwidth is centered about mid-wave infrared (MWIR).

13. The semiconductor device of claim 1, wherein the heterojunction has a plurality of epitaxial layers.

14. The semiconductor device of claim 13, wherein the top side of the heterojunction and the bottom side of the support substrate are bonded together.

15. The semiconductor device of claim 14, wherein a bond is created by epitaxially growing the heterojunction directly onto the support substrate.

16. The semiconductor device of claim 1 further comprising a passivation layer around a perimeter of the heterojunction.

17. The semiconductor device of claim 1, wherein the electrode further comprises transverse members that span across a top of the mesa structure and do not block the mesa structure in its entirety.

18. A method for making semiconductor device having a mesa structure, the method comprising:
   producing a heterojunction having a bottom side and a top side;

disposing a support substrate having a top side and a bottom side directly adjacent the top side of the heterojunction;

disposing an optical substrate having a top side and bottom side directly adjacent the top side of the support substrate; and substantially covering a perimeter of the top side of the optical substrate with an electrode for current injection and configured to:
  define an aperture wherein light passes therethrough; and
  not cover an area over the heterojunction;

wherein an area of the optical substrate is larger than the heterojunction thereby covering the top side of the heterojunction in its entirety and is substantially transmissive at a predetermined bandwidth associated with a bandgap of the heterojunction.

19. The method according to claim 18, wherein the heterojunction comprises a superlattice.

20. The method according to claim 18 further comprising mechanically coupling a submount to the electrode for improved heat flow therethrough.

21. The method according to claim 20 further comprising disposing an optical layer on the top side of the optical substrate.

22. The method according to claim 21, wherein the optical layer is etched.

* * * * *